United States Patent
Zhou et al.

(10) Patent No.: US 12,073,761 B2
(45) Date of Patent: Aug. 27, 2024

(54) DISPLAY PANEL AND ELECTRONIC DEVICE

(71) Applicants: Hefei BOE Display Technology Co., Ltd., Hefei (CN); BOE TECHNOLOGY GROUP CO., LTD., Beijing (CN)

(72) Inventors: Maoxiu Zhou, Beijing (CN); Min Cheng, Beijing (CN); Yuntian Zhang, Beijing (CN); Ke Dai, Beijing (CN); Haipeng Yang, Beijing (CN); Xiaoting Jiang, Beijing (CN); Chunxu Zhang, Beijing (CN); Li Tian, Beijing (CN); Mengmeng Li, Beijing (CN)

(73) Assignees: Hefei BOE Display Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 170 days.

(21) Appl. No.: 17/632,857

(22) PCT Filed: Dec. 4, 2020

(86) PCT No.: PCT/CN2020/134062
§ 371 (c)(1),
(2) Date: Feb. 4, 2022

(87) PCT Pub. No.: WO2022/116199
PCT Pub. Date: Jun. 9, 2022

(65) Prior Publication Data
US 2023/0360579 A1 Nov. 9, 2023

(51) Int. Cl.
*G09G 3/20* (2006.01)
*G11C 19/28* (2006.01)

(52) U.S. Cl.
CPC ... *G09G 3/2092* (2013.01); *G09G 2300/0408* (2013.01); *G09G 2300/0426* (2013.01);
(Continued)

(58) Field of Classification Search
None
See application file for complete search history.

(56) References Cited

U.S. PATENT DOCUMENTS 9,704,429 B2   7/2017   Seo et al.
10,916,187 B2  2/2021   Kim et al.
(Continued)

FOREIGN PATENT DOCUMENTS

CN   104134429 A   11/2014
CN   105895025 A   8/2016
(Continued)

OTHER PUBLICATIONS

International Search Report and Written Opinion for International Application No. PCT/CN2020/134062 mailed Sep. 3, 2021.

*Primary Examiner* — Stephen T. Reed
(74) *Attorney, Agent, or Firm* — Perilla Knox & Hildebrandt LLP; Kenneth A. Knox

(57) ABSTRACT

The present disclosure relates to the field of display technologies and, in particular to a display panel and an electronic device. The display panel comprises: Q rows of first scanning line groups arranged sequentially along a column direction; M columns of second scanning line groups arranged sequentially along a row direction; and at least one gate drive circuit, located on a side of the Q-th row of the first scanning line groups away from the (Q-1)-th row of the first scanning line groups. Each gate drive circuit comprises Q columns of shift register unit groups cascaded in stages. The q-th stage of the shift register unit groups is connected with the q-th row of the first scanning line groups through at
(Continued)

least one column of the second scanning line groups. $M \geq Q > 1$, $1 \leq q \leq Q$, and M, N, Q, q are all positive integers.

18 Claims, 11 Drawing Sheets

(52) U.S. Cl.
CPC .............. *G09G 2310/0267* (2013.01); *G09G 2310/0286* (2013.01); *G11C 19/28* (2013.01)

(56) References Cited

U.S. PATENT DOCUMENTS

| | | | |
|---|---|---|---|
| 2010/0168175 | A1 | 7/2010 | Adelt et al. |
| 2016/0240135 | A1* | 8/2016 | Kim .................... H10K 59/1315 |
| 2016/0267831 | A1* | 9/2016 | Seo ....................... G09G 3/2085 |
| 2021/0125553 | A1 | 4/2021 | Kim et al. |
| 2021/0201838 | A1* | 7/2021 | Wei ....................... G09G 3/3666 |

FOREIGN PATENT DOCUMENTS

| | | | |
|---|---|---|---|
| CN | 110137227 | A | 8/2019 |
| CN | 110992868 | A | 4/2020 |
| CN | 111474776 | A | 7/2020 |
| CN | 111540297 | A | 8/2020 |
| CN | 111999946 | A | 11/2020 |
| KR | 20150075947 | A | 7/2015 |
| KR | 101724845 | B1 | 4/2017 |
| KR | 102132864 | B1 | 7/2020 |

* cited by examiner

DISPLAY PANEL AND ELECTRONIC DEVICE

CROSS REFERENCE TO RELATED APPLICATION

The present application is a 35 U.S.C. § 371 national phase application of International Application No. PCT/CN2020/134062 filed Dec. 4, 2020, the entire disclosure of which is incorporated herein as a part of the present application for all purposes.

TECHNICAL FIELD

The present disclosure relates to the field of display technologies, and in particular to a display panel and an electronic device.

BACKGROUND

As the full-screen concept in small-sized and medium-sized display products becomes more popular, the ultimate stylish appearance is also being sought for large-sized display products (e.g., TVs). The TV market has moved towards the "bezel-less" era, and full-screen has become a new development trend of the TV market. However, there are currently problems with the picture quality of large-sized full-screen display products such as Mura (e.g., uneven brightness).

It should be noted that the information disclosed in the background section above is only for enhancing understanding of the background of the present disclosure, and thus may include information that does not constitute prior art known to those of ordinary skill in the art.

SUMMARY

According to a first aspect of the present disclosure, there is provided a display panel, including: Q rows of first scanning line groups arranged sequentially along a column direction; M columns of second scanning line groups arranged sequentially along a row direction; and at least one gate drive circuit, located on the side of the Q-th row of the first scanning line groups away from the (Q−1)-th row of the first scanning line groups, wherein each gate drive circuit comprises Q columns of shift register unit groups cascaded in stages, and wherein the q-th stage of the shift register unit groups is connected with the q-th row of the first scanning line groups through at least one column of the second scanning line groups, where M≥Q>1, 1≤q≤Q, and M, N, Q, q are all positive integers.

In an exemplary embodiment of the present disclosure, in the gate drive circuit, the 1-st stage of the shift register unit groups, the 2-nd stage of the shift register unit groups, . . . , the (Q−1)-th stage of the shift register unit groups, and the Q-th stage of the shift register unit groups are arranged sequentially along the row direction.

In an exemplary embodiment of the present disclosure, the gate drive circuit comprises a first gate drive circuit and a second gate drive circuit, wherein the Q-th stage of the shift register unit groups in the first gate drive circuit is disposed adjacent to the Q-th stage of the shift register unit groups in the second gate drive circuit or adjacent to the 1-st stage of the shift register unit groups in the second gate drive circuit.

In an exemplary embodiment of the present disclosure, each column of the second scanning line groups comprises a column of a second scanning line; each row of the first scanning line groups comprises a row of a first scanning line; each column of the shift register unit groups in each gate drive circuit comprises a column of shift register units; and one column of the shift register units is connected with one row of the first scanning line through one column of the second scanning line.

In an exemplary embodiment of the present disclosure, each row of the first scanning line groups comprises P rows of first scanning lines which are arranged sequentially from the side away from the gate drive circuit to the side adjacent to the gate drive circuit; each column of the second scanning line groups comprises P columns of second scanning lines which are arranged sequentially along the row direction; and each column of the shift register unit groups in each gate drive circuit comprises P columns of shift register units cascaded in stages, wherein the p-th stage of the shift register units in each column of the shift register unit groups in each gate drive circuit is connected with the p-th row of the first scanning lines in each row of the first scanning line groups through one column of the second scanning lines, and wherein P>1, 1≤p≤P, and P, p are both positive integers.

In an exemplary embodiment of the present disclosure, P columns of the shift register units in each column of the shift register unit groups in each gate drive circuit are arranged sequentially along the row direction, and at least one column of the shift register units in each column of the shift register unit groups in each gate drive circuit are target shift register units, wherein the number of stages and the number of columns of the target shift register units are not equal to each other.

In an exemplary embodiment of the present disclosure, among two adjacent columns of the shift register units in each column of the shift register unit groups in each gate drive circuit, the difference between the number of columns and the number of stages in one column of the shift register units is not equal to the difference between the number of columns and the number of stages in the other column of the shift register units.

In an exemplary embodiment of the present disclosure, the number of columns corresponding to the p-th stage of the shift register units in each shift register unit group of each gate drive circuit is equal to each other.

In an exemplary embodiment of the present disclosure, the Q-th stage of the shift register unit groups in the first gate drive circuit is disposed adjacent to the Q-th stage of the shift register unit groups in the second gate drive circuit; and the q-th stage of the shift register unit groups in the first gate drive circuit is disposed axisymmetrically with respect to the q-th stage of the shift register unit groups in the second gate drive circuit.

In an exemplary embodiment of the present disclosure, the Q-th stage of the shift register unit groups in the first gate drive circuit is disposed adjacent to the 1-st stage of the shift register unit groups in the second gate drive circuit; and the number of columns of the p-th stage of the shift register units in the q-th stage of the shift register unit groups in the first gate drive circuit is equal to the number of columns of the p-th stage of the shift register units in the q-th stage of the shift register unit groups in the second gate drive circuit.

In an exemplary embodiment of the present disclosure, the display panel further includes: P rows of clock signal lines arranged sequentially along the column direction, wherein the p-th stage of the shift register units in each column of the shift register unit groups in each gate drive circuit is connected with the p-th row of the clock signal lines.

In an exemplary embodiment of the present disclosure, the display panel further includes: a plurality of columns of data lines arranged sequentially along the row direction; at least one source drive circuit, located on the same side of the display panel as the gate drive circuit, wherein the source drive circuit is connected with the data lines; and a plurality of pixel units, arranged in an array along the row direction and the column direction, wherein each pixel unit comprises a plurality of sub-pixels arranged sequentially along the row direction, the sub-pixels are connected with the data lines and the first scanning lines; at least one column of the data lines is arranged between any two adjacent columns of the sub-pixels along the row direction, at least one column of the second scanning lines is arranged between any adjacent pixel units along the row direction, and at least one row of the first scanning lines is arranged between any adjacent pixel units along the column direction; and wherein the first scanning lines and the second scanning lines are connected through a first through-hole structure.

In an exemplary embodiment of the present disclosure, the display panel further includes: a plurality of rows of first common lines arranged sequentially along the column direction, and a plurality of columns of second common lines arranged sequentially along the row direction, wherein the first common lines and the second common lines are connected with the sub-pixels through a second through-hole structure and a third through-hole structure, respectively; and wherein a column of the second common lines is disposed between at least part of adjacent pixel units along the row direction, and a row of the first common lines is disposed between any adjacent pixel units along the column direction.

In an exemplary embodiment of the present disclosure, a column of the data lines is disposed between any two adjacent columns of the sub-pixels along the row direction, and each sub-pixel in each column of the sub-pixels is connected with one column of the data lines adjacent to the sub-pixel; one row of the first scanning lines and one row of the first common lines are disposed between any adjacent pixel units along the column direction, and each sub-pixel in each row of the sub-pixels is connected with one column of the first scanning lines adjacent to the sub-pixel; and one column of the second scanning lines and one column of the second common lines are disposed between part of two adjacent columns of the pixel units along the row direction, and two columns of the second scanning lines are disposed between another part of two adjacent columns of the pixel units along the row direction.

In an exemplary embodiment of the present disclosure, the display panel has a plurality of columns of first wiring areas, and the first wiring areas are disposed between any adjacent pixel units along the column direction. One part of the plurality of columns of the first wiring areas comprises first sub-wiring areas and another part comprises second sub-wiring areas. Two columns of the second scanning lines are disposed in each column of the first sub-wiring areas, and two columns of the second scanning lines in the same first sub-wiring area are connected with different rows of the first scanning lines through a through-hole structure, respectively. Each column of the second sub-wiring areas is provided with one column of the second scanning lines. The plurality of columns of the first wiring areas are divided into a plurality of columns of first wiring area groups, each column of the first wiring area groups comprises 8 columns of first wiring areas arranged sequentially along the row direction, the n-th column of the first wiring areas in each column of the first wiring area groups comprises the first sub-wiring areas, and the remaining 7 columns of the first wiring areas in each column of the first wiring area groups comprises the second sub-wiring areas, where 1≤n≤8, and n is a positive integer.

In an exemplary embodiment of the present disclosure, the sub-pixels include: a sub-pixel electrode, having a plurality of first electrode strips which are arranged at intervals along the row direction; a common electrode, disposed in the same layer as the sub-pixel electrode, wherein the common electrode has a plurality of second electrode strips which are arranged at intervals along the row direction, the second electrode strips and the first electrode strips are alternately arranged along the row direction, and the common electrode is connected with the second common lines and the first common lines through the third through-hole structure and the second through-hole structure, respectively; and a transistor, comprising a gate, an active layer, and a first terminal and a second terminal disposed in the same layer, wherein the gate are disposed in the same layer as and connected with the first scanning lines, the first terminal is connected with one end of the active layer, the first terminal is disposed in the same layer as and connected with the data lines, and the second terminal is connected with the other end of the active layer and further connected with the sub-pixel electrode through a fourth through-hole structure.

In an exemplary embodiment of the present disclosure, the common electrode of each sub-pixel is connected with each other.

In an exemplary embodiment of the present disclosure, a plurality of the first through-hole structures are provided and divided into a first group and a second group, wherein the number of the first through-hole structures in the first group is equal to that of the shift register units in the first gate drive circuit, and each of the first through-hole structures in the first group is connected with a respective one of the shift register units in the first gate drive circuit; and the number of the first through-hole structures in the second group is equal to that of the shift register units in the second gate drive circuit, and each of the first through-hole structures in the second group is connected with a respective one of the shift register units in the second gate drive circuit. Besides, the first group and the second group are axisymmetric to each other; or the distance between the first through-hole structures located in the same row in the first group and the second group is a through-hole distance, wherein the through-hole distance of each row is equal.

In an exemplary embodiment of the present disclosure, each pixel unit comprises three sub-pixels, respectively a red sub-pixel, a green sub-pixel and a blue sub-pixel, arranged sequentially along the row direction, wherein among two adjacent pixel units along the row direction, the red sub-pixel of one pixel unit is adjacent to the blue sub-pixel of the other pixel unit.

According to a second aspect of the present disclosure, there is provided an electronic device, comprising the display panel as described above.

BRIEF DESCRIPTION OF THE DRAWINGS

The above-mentioned and other features and advantages of the present disclosure will become more apparent by describing the exemplary embodiments thereof in detail with reference to the accompanying drawings.

DETAILED DESCRIPTION

Figure 1:
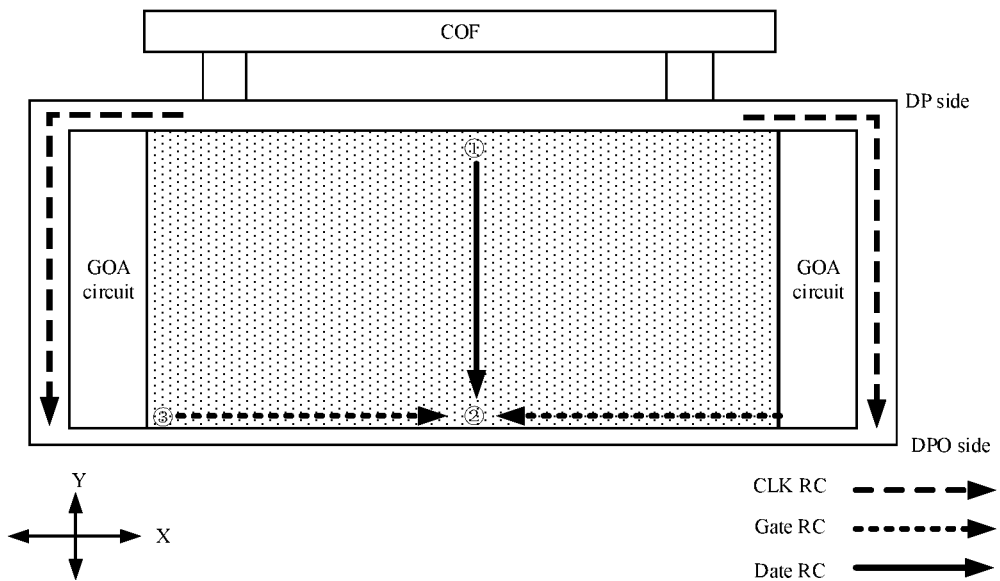
FIG. 1 is a structural schematic diagram of a conventional large-sized display panel.

In order to make the objectives, technical solutions, and advantages of the present disclosure clearer, embodiments of the present disclosure will be described in detail below in conjunction with the accompanying drawings. It should be noted that the implementations may be implemented in a plurality of different forms. Those of ordinary skill in the art can easily understand the fact that the method and content may be transformed into various forms without departing from the purpose and scope of the present disclosure. Therefore, the present disclosure should not be interpreted as being limited to the content described in the following implementations. In the absence of conflict, embodiments in the present disclosure and the features in embodiments may be combined with each other arbitrarily.

In the drawings, for the sake of clarity, the size of each component, the thickness of each layer, or the area may be exaggerated. Therefore, an embodiment of the present disclosure is not necessarily limited to such size, and the shape and size of each component in the drawings do not reflect the true ratio. In addition, the drawings schematically illustrate ideal examples, and an embodiment of the present disclosure is not limited to the shapes or numerical values shown in the drawings, etc.

At present, large-sized display panels have a poor uniformity of charging rate due to their large size, which increases the effect of in-panel resistance and capacitance (abbreviated as RC) on the charging rate. This is especially true for full-screen display panels, due to their complex internal wiring, that have more RC. Specifically, the RC that affects the uniformity of the in-panel charging rate mainly includes the RC brought by clock signal lines (abbreviated as CLK RC) and the RC brought by scanning lines (abbreviated as Gate RC); and the RC brought by data lines (abbreviated as Data RC).

As shown in FIG. 1, for a conventional large-sized display panel (e.g., a normal panel), its clock signal (e.g., CLK signal) is introduced from the COF (chip on film) on the DP side (the side where the source driver is disposed is usually called the DP side) and enters the panel along a column direction Y, e.g., from the DP side to the DPO side (the side opposite to the DP side in the column direction Y), which presents a gradually increased CLK RC effect and an effect on the charging rate showing that from the DP side to the DPO side, the charging rate is gradually decreased. The large-sized display panel is usually dual-driven, as shown in FIG. 1, and the gate drive circuit (usually referred to as GOA circuit when the gate drive circuit is located on the array substrate) is arranged on two opposite sides along the row direction X of the panel (e.g., the left and right sides shown in FIG. 1). The scanning signal (Gate signal) in each row is transmitted from the two opposite sides along the row direction X of the panel to the center of the panel. In other words, the start of the Gate signal in each row is located on the two opposite sides along the row direction X of the panel with the end located at the center of the panel. As a result, the charging rate of the pixel is gradually decreased from both sides in the row direction X toward the center thereof under the effect of the Gate RC. The data signal is input from the COF terminal on the DP side and extends to the DPO side, and the pixel charging rate thereof is gradually decreased under the effect of the Data RC.

In view of above, as shown in FIG. 1, at position ①, the CLK RC is small, the Gate RC is large, and the Data RC is small, rendering the comprehensive effect at position ① to be small, and the charging rate at position ① is excellent through simulation test. At position ② shown in FIG. 1, the CLK RC is large, the Gate RC is large, the Data RC is large, rendering the comprehensive effect at position ② to be large, and the charging rate at position ② is poor through simulation test. A position ③ shown in FIG. 1, the CLK RC is large, the Gate RC is small, and the Data RC is large, rendering the comprehensive effect at position ③ to be large, and the charging rate at position ③ is good through simulation test. This is specifically shown in Table 1 below. That is, at position ② shown in FIG. 1, effects of the CLK RC, the Gate RC, and the Data RC are all the largest, making it the worst point in terms of the charging rate. The RC distribution of the in-panel design in such Normal panel is extremely uneven, which causes the charging rate difference of the pixels in-panel to be large, and seriously affects the panel image quality. This is especially true for full-screen display panels, wherein such difference becomes more pronounced due to the poor charging rate.

Figure 2:
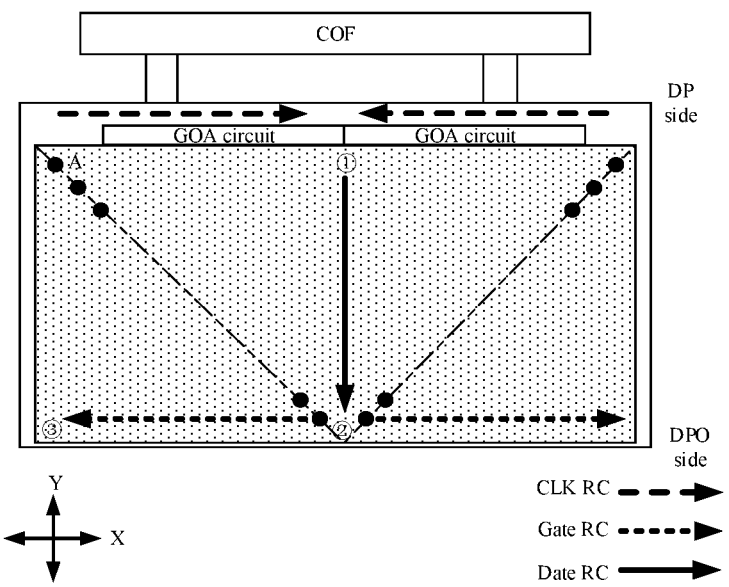
FIG. 2 is a structural schematic diagram of an ultra-narrow bezel display panel in the related art.

As shown in FIG. 2, in order to further improve the full-screen effect, an ultra-narrow bezel display panel has been proposed in the related art, where a GOA circuit is arranged on the DP side of the panel. As compared to the aforementioned Normal panel, there is one more vertical scanning line (V Gate) extending in the column direction Y and passing through pixels in the display area, and this vertical scanning line is switched through a through-hole structure (the location of this through-hole structure is a joint point A shown in FIG. 2) to be connected with a horizontal scanning line (H Gate) extending in the row direction X, thus enabling row driving, and implementing ultra-narrow bezels on two opposite sides in the row direction X and on the DPO side. With respect to such panel, the CLK signal is input from COFs on the two opposite sides along the row direction X of the panel and introduced into the panel by the GOA circuit on the DP side, wherein the GOA scanning direction is from the DP side to the DPO side. The Data signal is input from the COF terminal on the DP side and extends to the DPO side. It should be understood that this accessing way of the Gate signal is understood to be an access method using a V-line (a thin single-dot chain line as shown in FIG. 2), and this ultra-narrow bezel display panel may be defined as a V-panel. It should be noted that the V-line refers to the line that connects each joint point A in the panel in sequence. As shown in FIG. 2, the Date RC is gradually increased from the DP side to the DPO side, the CLK RC is gradually increased from the two opposite sides in the row direction X to the center, and the V Gate RC is gradually increased from the junction to the two opposite sides in the row direction X.

In view of above, as shown in FIG. 2, at position ①, the CLK RC is small, the H Gate RC is small, the V Gate RC is large, and the Data RC is small, rendering the comprehensive effect at position ① to be smaller, and the charging rate at position ① is good through simulation test. At position ② shown in FIG. 1, the CLK RC is large, the H Gate RC is large, the V Gate RC is small, and the Data RC is large, rendering the comprehensive effect at position ② to be larger, and the charging rate at position ② is good through simulation test. At position ③ shown in FIG. 1, the CLK RC is large, the H Gate RC is large, the V Gate RC is large, and the Data RC is large, rendering the comprehensive effect at position ③ to be large, and the charging rate at position ③ is poor through simulation test. This is specifically shown in Table 1 below. That is, with respect to such design of the V-panel shown in FIG. 2, although the pixel charging rate at position ② is improved, the position ③ has the greatest RC effect, making it the worst point in terms of the charging rate. Thus, the panel image quality is seriously effected, and the phenomena such as Mura and Crosstalk will be more serious.

TABLE 1

| type | position | CLK RC | Gate RC H | Gate RC V | Date RC | comprehensive effect | charging rate |
|---|---|---|---|---|---|---|---|
| Normal panel | ① | small | large | small | small | smaller | excellent |
| | ② | large | large | large | large | large | poor |
| | ③ | large | large | small | large | larger | good |
| V-panel | ① | small | small | large | small | smaller | good |
| | ② | large | large | small | large | larger | good |
| | ③ | large | large | large | large | large | poor |

In summary, it may be seen that in a Normal panel and a V-panel, due to the different amplitudes of the CLK, Gate and Data resistances and capacitances at different in-panel locations, the charging rate difference of the pixels is larger, which difference has a greater effect in a large-sized full-screen, thereby seriously affecting the panel image quality. To make improvements in such situation, an embodiment of the present disclosure provide a display panel. As shown in conjunction with FIGS. 3 and 4, the display panel according to an embodiment of the present disclosure may include second scanning line groups (abbreviated as V Gate groups), first scanning line groups (abbreviated as H Gate groups), and at least one gate drive circuit (abbreviated as GOA circuit).

The first scanning line groups may be located in the display area of the display panel, and the first scanning line groups may be provided in Q rows. It should be noted that $1<Q$ and Q is a positive integer. In other words, the first scanning line groups may be provided in a plurality of rows, where Q rows of the first scanning line groups are arranged sequentially along the column direction Y. It should be understood that the Q rows of the first scanning line groups arranged sequentially along the column direction Y as mentioned in an embodiment of the present disclosure mean that the 1-st row of the first scanning line groups, the 2-nd row of the first scanning line groups, . . . , the (Q−1)-th row of the first scanning line groups, and the Q-th row of the first scanning line groups are arranged sequentially along the column direction Y.

The second scanning line groups may be located in the display area of the display panel, and the second scanning line groups may be provided in M columns. It should be noted that $1<Q \leq M$ and M is a positive integer. In other words, the second scanning line groups may be provided in a plurality of columns, where M columns of the second scanning line groups are arranged sequentially along the row direction X. It should be understood that the M columns of the second scanning line groups arranged sequentially along the row direction X as mentioned in an embodiment of the present disclosure mean that the 1-st column of the second scanning line groups, the 2-nd column of the second scanning line groups, . . . , the (M−1)-th column of the second scanning line groups, and the M-th column of the second scanning line groups are arranged sequentially along the row direction X.

There is provided at least one gate drive circuit. The gate drive circuit may be integrated on the array substrate and located in the non-display area of the display panel, but is not limited thereto. The gate drive circuit may also be integrated on a flexible circuit board and connected with the array substrate.

Figure 3:
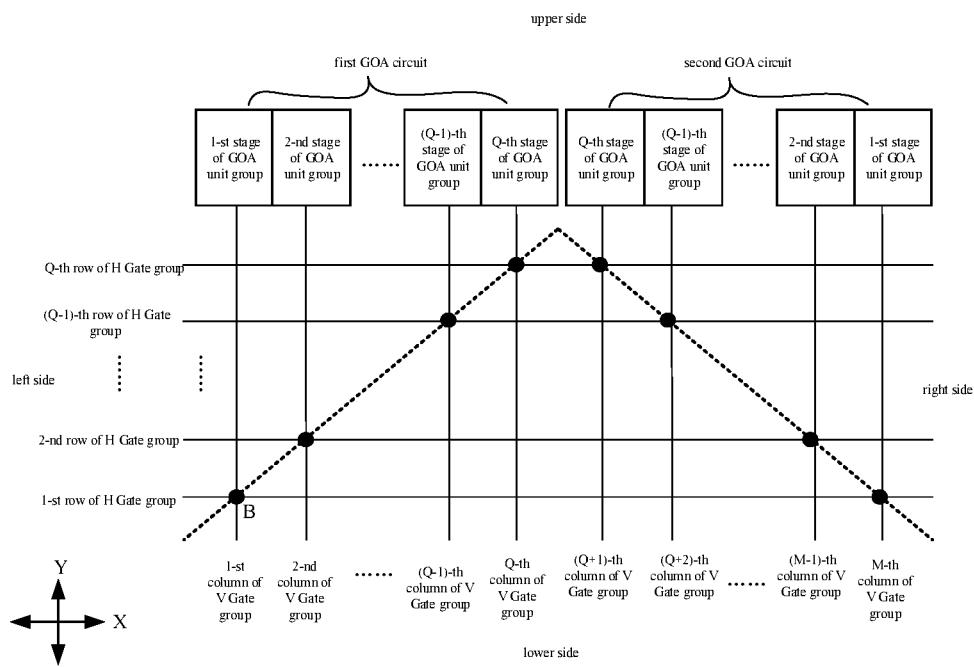
FIG. 3 is a partial structural schematic diagram of a display panel described in one embodiment of the present disclosure.
Figure 4:
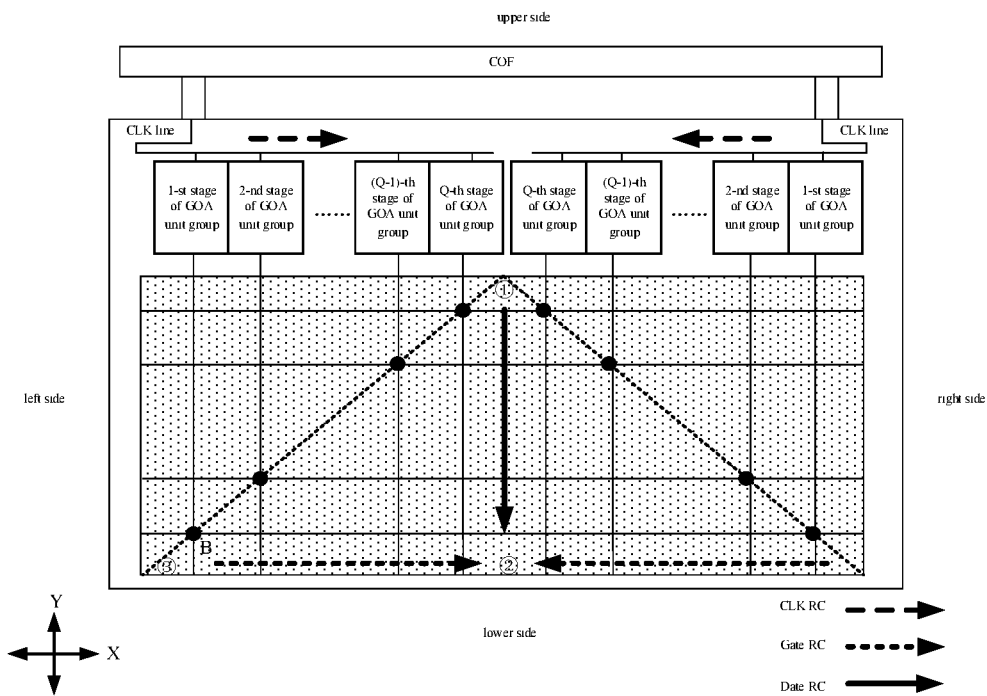
FIG. 4 is a structural schematic diagram of a display panel described in one embodiment of the present disclosure.

In an embodiment of the present disclosure, as shown in conjunction with FIGS. 3 and 4, the gate drive circuit may be located on the side of the Q-th row of the first scanning line groups away from the (Q−1)th row of the first scanning line groups. For example, as shown in FIGS. 3 and 4, the display panel may have opposite left and right sides in the row direction X and opposite upper and lower sides in the column direction Y. The Q row of the first scanning line groups is arranged sequentially from the lower side toward a direction adjacent to the upper side. In other words, the first row of the first scanning line groups is disposed adjacent to the lower side, and the Q-th row of the first scanning line groups is disposed adjacent to the upper side. That is, the aforementioned gate drive circuit may be located on the side of the Q-th row of the first scanning line groups adjacent to the upper side.

Each gate drive circuit includes Q columns of shift register unit groups (abbreviated as GOA unit groups) cascaded in stages. That is, the number of columns of the shift register unit groups in each gate drive circuit is equal to the number of rows of the first scanning lines in the first scan line groups. It should be noted that, the Q columns of shift register unit groups cascaded in stages as mentioned in an embodiment of the present disclosure mean that, the shift register units in the 2-nd stage of the shift register unit groups start to output the gate driving signal after all the shift register units in the 1-st stage of the shift register unit groups output the gate driving signal, the shift register units in the 3-rd stage of the shift register unit groups start to output the gate driving signal after all the shift register units in the 2-nd stage of the shift register unit groups output the gate driving signal, . . . , and the shift register units in the Q-th stage of the shift register unit groups start to output the gate driving signal after all shift register units in the Q-1th stage of the shift register unit groups output the gate driving signal.

It should be noted that, the q-th stage of the shift register unit groups is connected with the q-th row of the first scanning line groups through at least one column of the second scanning line groups, and the connection point is shown as point B in FIG. 3, where 1≤q≤Q, and q is a positive integer. That is, an embodiment of the present disclosure scans row by row from the side away from the gate drive circuit to the side adjacent to the gate drive circuit. As compared to the aforementioned Normal panel and V-panel, an embodiment of the present disclosure changes the direction of the scanning signal, so that mutual compensation between CLK RC, Gate RC, and Data RC may be achieved. That is, as compared with the aforementioned Normal panel and V-panel, the uniformity of the pixel charging rate of the display area may be improved while the full-screen display is realized.

Specifically, in the gate drive circuit according to an embodiment of the present disclosure, the 1-st stage of the shift register unit groups, the 2-nd stage of the shift register unit groups, . . . , the (Q-1)-th stage of the shift register unit groups, and the Q-th stage of the shift register unit groups are arranged sequentially along the row direction X. For example, in the gate drive circuit, the 1-st stage of the shift register unit groups, the 2-nd stage of the shift register unit groups, . . . , the (Q-1)-th stage of the shift register unit groups, and the Q-th stage of the shift register unit groups are arranged sequentially from the left side of the display panel to the right side of the display panel. Alternatively, in the gate drive circuit, the 1-st stage of the shift register unit groups, the 2-nd stage of the shift register unit groups, . . . , the (Q-1)-th stage of the shift register unit groups, and the Q-th stage of the shift register unit groups are arranged sequentially from the right side of the display panel to the left side of the display panel.

Further, in order to accommodate a large-sized display panel, two gate drive circuits may be provided, as shown in FIGS. 3 and 4, which are a first gate drive circuit (abbreviated as a first GOA circuit) and a second gate drive circuit (abbreviated as a second GOA circuit), respectively. The Q-th stage of the shift register unit groups in the first gate drive circuit is disposed adjacent to the Q-th stage of the shift register unit groups in the second gate drive circuit. That is, the 1-st stage of the shift register unit groups, the 2-nd stage of the shift register unit groups, . . . , the (Q-1)-th stage of the shift register unit groups and the Q-th stage of the shift register unit groups in the first gate drive circuit are arranged sequentially from the left side of the display panel to the center of the display panel. Further, the 1-st stage of the shift register unit groups, the 2-nd stage of the shift register unit groups, . . . , the (Q-1)-th stage of the shift register unit groups and the Q-th stage of the shift register unit groups in the second gate drive circuit are arranged sequentially from the right side of the display panel to the center of the display panel.

It should be noted that, the present disclosure is not limited to that the Q-th stage of the shift register unit groups in the first gate drive circuit is disposed adjacent to the Q-th stage of the shift register unit groups in the second gate drive circuit. Alternatively, it may be that the Q-th stage of the shift register unit groups in the first gate drive circuit is disposed adjacent to the 1-st stage of the shift register unit groups in the second gate drive circuit. That is, the 1-st stage of the shift register unit groups, the 2-nd stage of the shift register unit groups, . . . , the (Q-1)-th stage of the shift register unit groups and the Q-th stage of the shift register unit groups in the first gate drive circuit are arranged sequentially from the left side of the display panel to the center of the display panel. Further, the 1-st stage of the shift register unit groups, the 2-nd stage of the shift register unit groups, . . . , the (Q-1)-th stage of the shift register unit groups and the Q-th stage of the shift register unit groups in the second gate drive circuit are arranged sequentially from the center of the display panel to the right side of the display panel.

In view of above, according to an embodiment of the present disclosure, when the Q-th stage of the shift register unit groups in the first gate drive circuit is disposed adjacent to the Q-th stage of the shift register unit groups in the second gate drive circuit, the connection point B between each second scanning line group and each first scanning line group in the entire display panel is sequentially connected in a direction from the left side to the right side of the display panel as shown in FIG. 3 thereby forming an inverted V-line (as shown by dotted line in FIG. 3). That is, the display panel according to an embodiment of the present disclosure adopts an inverted V-connection as a whole. In other words, the display panel according to an embodiment of the present disclosure may be defined as an inverted V-panel.

In an embodiment of the present disclosure, the display panel may further include at least one source drive circuit and a plurality of columns of data lines. The plurality of columns of data lines are arranged sequentially in the row direction X and connected with the source drive circuit. The source drive circuit may be located on the same side of the display panel as the aforementioned gate drive circuit. That is, when the gate drive circuit is located on the upper side of the display panel as shown in FIG. 3, the source drive circuit may also be located on the upper side of the display panel, so that the full-screen display may be further implemented. It should be noted that source drive circuit may be directly integrated on the array substrate in the non-display area, or may be connected with the array substrate in a COF way. That is, the source drive circuit may be disposed on the COF as shown in FIG. 4. The data lines may be located in the display area of the display panel, and the data lines are not shown in FIGS. 3 and 4.

In addition, the CLK signal may be introduced through the COF on the upper side of the display panel as shown in FIG. 4. That is, the COF on the upper side of the display panel may be connected with each shift register unit group in a gate drive circuit through one or more CLK lines, and is introduced into the panel (e.g., in the display area with pixels) through each shift register unit group on the upper side. The cascading direction of the shift register unit groups is from the left and right sides of the display panel towards the center, and the scanning direction is from the lower side of the display panel to the upper side thereof. That is, the scanning direction is from the lower side of the display panel to the upper side thereof.

In an embodiment of the present disclosure, as shown in FIG. 4, the Gate RC is gradually increased from the junction (e.g., the connection point B) to the left and right sides; the Data RC is gradually increased from the upper side to the lower side; and the CLK RC is gradually increased from the two opposite sides to the center in the row direction X. This access way for the signal allows for some compensation of the RC, so that the uniformity of the in-panel charging rate is optimized.

Specifically, as shown in FIG. 4, at position ①, the CLK RC is large, the H Gate RC is small, the V Gate RC is small, and the Data RC is small, rendering the comprehensive effect at position ① to be smaller, and the charging rate at position ① is excellent through simulation test. At position ② shown in FIG. 4, the CLK RC is small, the H Gate RC is large, the V Gate RC is large, and the Data RC is large, rendering the comprehensive effect at position ② to be larger, and the charging rate at position is good through simulation test. At position ③ shown in FIG. 4, the CLK RC is small, the H Gate RC is large, the V Gate RC is small, and the Data RC is large, rendering the comprehensive effect at position $\overline{3}$ to be larger, and the charging rate at position $\overline{3}$ is excellent through simulation test. This is shown in Table 2 below. That is, with respect to such design of the inverted V-panel as shown in FIG. 4, the CLK RC, the Gate RC, and the Data RC compensate for each other, so that the charging rate at each position is not differentiated, the difference of the in-panel charging rate is reduced, and the in-panel image quality is greatly improved.

TABLE 2

| type | position | CLK RC | Gate RC H | Gate RC V | Date RC | comprehensive effect | charging rate |
|---|---|---|---|---|---|---|---|
| inverted V-panel | ① | large | small | small | small | smaller | excellent |
| | ② | small | large | large | large | larger | good |
| | ③ | small | large | small | large | larger | excellent |

Figure 5:
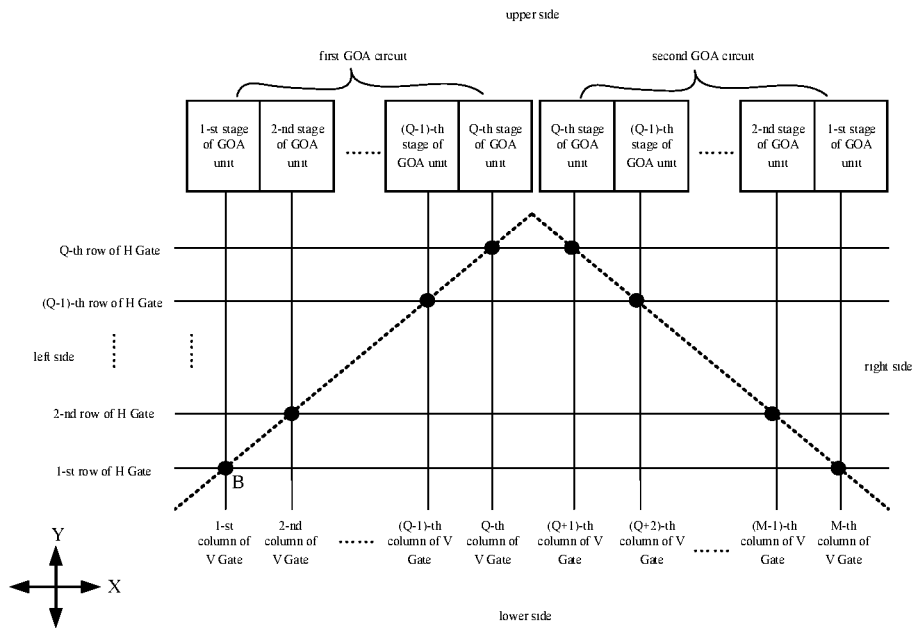
FIG. 5 is a partial structural schematic diagram of a display panel described in another embodiment of the present disclosure.

In an embodiment of the present disclosure, each column of the aforementioned second scanning line groups may include a column of the second scanning line (abbreviated as V Gate), each row of the first scanning line groups includes a row of the first scanning line (abbreviated as H Gate), and each column of the shift register unit groups includes a column of the shift register units (abbreviated as GOA unit). A column of the shift register units is connected with a row of the first scanning line through a column of the second scanning line, specifically as shown in FIG. 5, wherein the point B in FIG. 5 is a connection point between the second scanning line and the first scanning line.

It should be understood that the first scanning line and the second scanning line are located at different layers of the display panel, and there is an insulation layer between the first scanning line and the second scanning line. Therefore, in order to realize the connection between the first scanning line and the second scanning line, a through-hole structure may be formed on the insulation layer between the first scanning line and the second scanning line. That is, the first scanning line may be connected with the second scanning line through the through-hole structure, wherein the location of the through-hole structure is at point B in FIG. 5.

In another embodiment of the present disclosure, each column of the second scanning line groups includes P columns of the second scanning lines which are arranged sequentially along the row direction X; each row of the first scanning line groups comprises P rows of the first scanning lines which are arranged sequentially from the side away from the gate drive circuit to the side adjacent to the gate drive circuit; and each column of the shift register unit groups in each gate drive circuit includes P columns of shift register units cascaded in stages, where P>1, and P is a positive integer. In other words, the number of columns of the second scanning lines in each column of the second scanning line groups, the number of rows of the first scanning lines in each row of the first scanning line groups, and the number of columns of the shift register units in each column of the shift register unit groups are all multiple and equal to each other. Specifically, the p-th stage of the shift register units in each column of the shift register unit groups in each gate drive circuit is connected with the p-th row of the first scanning lines in each row of the first scanning line groups through one column of the second scanning lines, where 1≤p≤P, and p is a positive integer.

It should be noted that each column of the shift register units as mentioned in an embodiment of the present disclosure includes only one shift register unit.

In an embodiment of the present disclosure, P columns of the shift register units in each column of the shift register unit groups in each gate drive circuit are arranged sequentially along the row direction X. In other words, the 1-st column of the shift register units, the 2-nd column of the shift register units, . . . , the (P−1)-th column of the shift register units, and the P-th column of the shift register units in each column of the shift register unit groups may be arranged sequentially along a direction from the left side to the right side of the display panel or along a direction from the right side to the left side of the display panel. Specifically, taking the q-th column of the shift register unit groups in the first gate drive circuit as an example for detailed description, the 1-st column of the shift register units in the q-th column of the shift register unit groups may be connected with the 1-st row of the first scanning lines in the q-th row of the first scanning line groups through a column of the second scanning lines.

Figure 6:
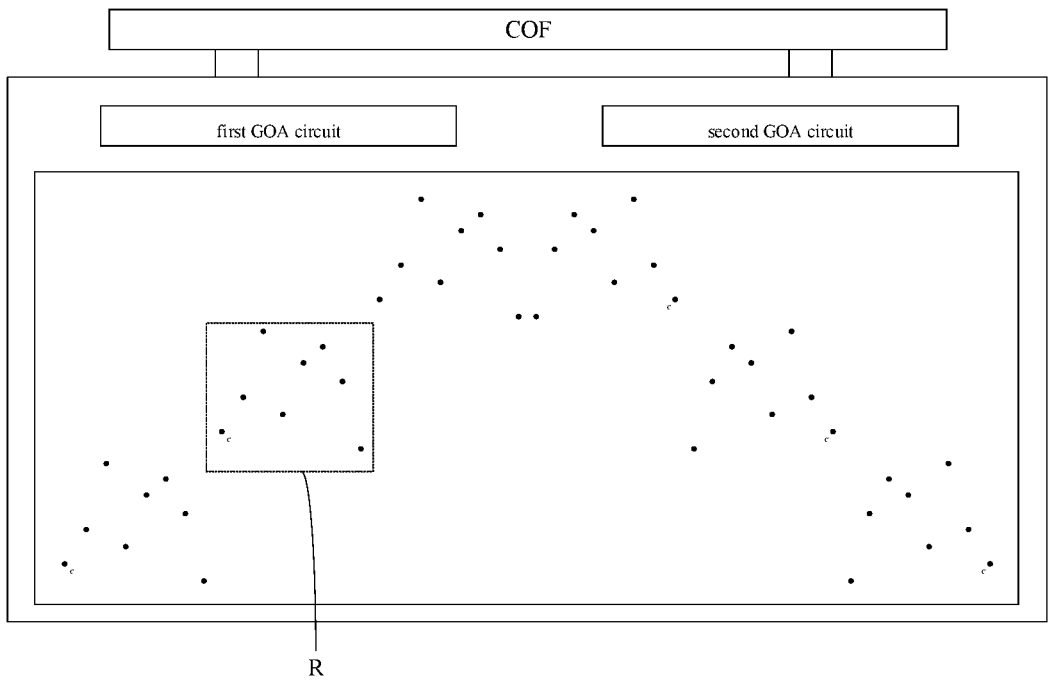
FIG. 6 is a structural schematic diagram of a display panel described in another embodiment of the present disclosure.
Figure 7:
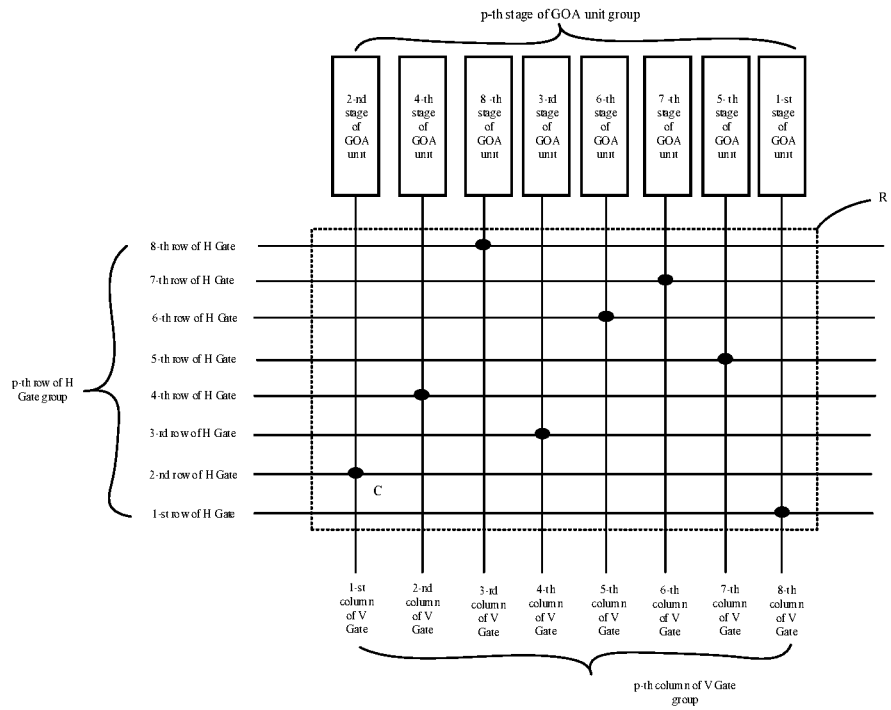
FIG. 7 illustrates an enlarged structural schematic diagram of the R part shown in FIG. 6.

At least one column of the shift register units in each column of the shift register unit groups in each gate drive circuit are target shift register units. The number of stages and the number of columns in the target shift register units are not equal. The shift register unit located in the 2-nd column in each column of the shift register unit groups (e.g., the shift register unit connected with the 2-nd column of the second scanning line in the second scanning line group) being the target shift register unit is taken as an example. That is, the shift register unit located in the 2-nd column in each shift register unit group may be a shift register unit of another stage than the 2-nd stage in each shift register unit group. For example, as shown in conjunction with FIGS. 6 and 7, the shift register unit located in the 2-nd column in each shift register unit group may be a shift register unit of the 4-th stage in each shift register unit group. In an embodiment of the present disclosure, the cascading sequence of each shift register unit in each column of the shift register unit groups is changed, such that the connection point (point C shown in FIG. 7) between each of the second scanning lines and each of the first scanning lines in each group is arranged in a chaotic order in-panel, as shown in FIGS. 6 and 7. That is, the mosaic effect is performed on the connection point between each of the second scanning lines and each of the first scanning lines in each group, so that the effect of Mura on the image quality in the whole panel is reduced, and the aperture ratio of the full-screen panel may be improved.

Optionally, among two adjacent columns of shift register units in each shift register unit group, the difference between the number of columns and the number of stages in one column of shift register units is not equal to the difference between the number of columns and the number of stages of the other column of shift register units. As shown in FIG. 6, the shift register units located in the 1-st column and the 2-nd column are taken as an example. The shift register unit located in the 1-st column is the 2-nd stage of the shift register unit, and the difference between the number of columns and the number of stages thereof is negative 1. The shift register unit located in the 2-nd column is the 4-th stage of the shift register unit, and the difference between the number of the columns and the number of the stages thereof is negative 2. Such design corresponds to the in-panel situation, and the connection point C (as shown in FIG. 7) between each of the second scanning lines and each of the first scanning lines in each group may be arranged in a disorder way in-panel, so as to avoid the situation where each connection point C in each group is intensively arranged along one direction and thus a serious Mura is caused. That is, the effect of Mura on the image quality is improved and the product quality is improved.

Further, among any two adjacent columns of shift register units in each shift register unit group, the difference between the number of columns and the number of stages in one column of shift register units is not equal to the difference between the number of columns and the number of stages of the other column of shift register units.

It should be noted that, each stage of the shift register units in each shift register unit group of each gate drive circuit is arranged in the same order. In other words, the number of columns corresponding to the p-th stage of the shift register units in each shift register unit group of each gate drive circuit is equal.

The 1-st stage of the shift register unit groups, the 2-nd stage of the shift register unit groups, . . . , the (Q−1)-th stage of the shift register unit groups, and the Q-th stage of the shift register unit groups in the first gate drive circuit being arranged sequentially in the row direction X is used as an example. The arrangement sequence of the shift register units in the 1-st stage of the shift register unit groups, the 2-nd stage of the shift register unit groups, . . . , the (Q−1)-th stage of the shift register unit groups, and the Q-th stage of the shift register unit groups in the first gate drive circuit may be as shown in FIG. 7. It should be understood that the shift register units in the shift register unit groups are not limited to the 8 shift register units shown in FIG. 7, the number may be more or less, and the arrangement sequence is not limited to the sequence shown in FIG. 7. There may also be more arrangement sequences, as long as it is ensured that among any two adjacent columns of the shift register units in each shift register unit group, the difference between the number of columns and the number of stages of one column is not equal to the difference between the number of columns and the number of stages of the other column.

When the Q-th stage of the shift register unit groups in the first gate drive circuit is disposed adjacent to the Q-th stage of the shift register unit groups in the second gate drive circuit, the q-th stage of the shift register unit groups in the first gate drive circuit is disposed axisymmetrically with respect to the q-th stage of the shift register unit groups in the second gate drive circuit. That is, each stage of the shift register unit groups including 8 stages of shift register units is used as an example. The 2-nd shift register unit, the 4-th shift register unit, the 8-th shift register unit, the 3-rd shift register unit, the 6-th shift register unit, the 7-th shift register unit, the 5-th shift register unit, and the 1-st shift register unit in the q-th stage of the shift register unit groups in the first gate drive circuit may be arranged sequentially along a direction from the left side to the right side as shown in FIG. 7. The 2-nd shift register unit, the 4-th shift register unit, the 8-th shift register unit, the 3-rd shift register unit, the 6-th shift register unit, the 7-th shift register unit, the 5-th shift register unit, and the 1-st shift register unit in the q-th stage of the shift register unit groups in the second gate drive circuit may be arranged sequentially in a direction from the right side to the left side as shown in FIG. 7.

In addition, when the Q-th stage of the shift register unit groups in the first gate drive circuit is disposed adjacent to the 1-st stage of the shift register unit groups in the second gate drive circuit, the number of columns of the p-th stage of the shift register units in the q-th stage of the shift register unit groups in the first gate drive circuit is equal to the number of columns of the p-th stage of the shift register units in the q-th stage of the shift register unit groups in the second gate drive circuit. That is, each stage of the shift register unit groups including 8 stages of shift register units is used as an example. The 2-nd shift register unit, the 4-th shift register unit, the 8-th shift register unit, the 3-rd shift register unit, the 6-th shift register unit, the 7-th shift register unit, the 5-th shift register unit, and the 1-st shift register unit in the q-th stage of the shift register unit groups in the first gate drive circuit may be arranged sequentially in a direction from the left side to the right side as shown in FIG. 7. The 2-nd shift register unit, the 4-th shift register unit, the 8-th shift register unit, the 3-rd shift register unit, the 6-th shift register unit, the 7-th shift register unit, the 5-th shift register unit, and the 1-st shift register units in the q-th stage of the shift register unit groups in the second gate drive circuit may be arranged sequentially in a direction from the left side to the right side as shown in FIG. 7.

In an embodiment of the present disclosure, the display panel further includes P rows of clock signal lines (e.g., CLK) arranged sequentially in the column direction Y. These clock signal lines may be disposed on the side of the gate drive circuit away from the first scanning lines. That is, the clock signal lines are located closer to the upper side of the display panel than the gate drive circuit. It should be understood that, P rows of clock signal lines arranged sequentially in the column direction Y as mentioned in an embodiment of the present disclosure mean that the 1-st row of the clock signal lines (CLK 1), the 2-nd row of the clock signal lines (CLK 2), . . . , the (P−1)-th row of the clock signal lines (CLK P−1), and the P-th row of the clock signal lines (CLK P) are arranged sequentially in a direction from the upper side to the lower side of the display panel or in a direction from the lower side to the upper side of the display panel. However, the present disclosure is not limited thereto, and each row of the clock signal lines may also be arranged in a disorder way.

Figure 8:
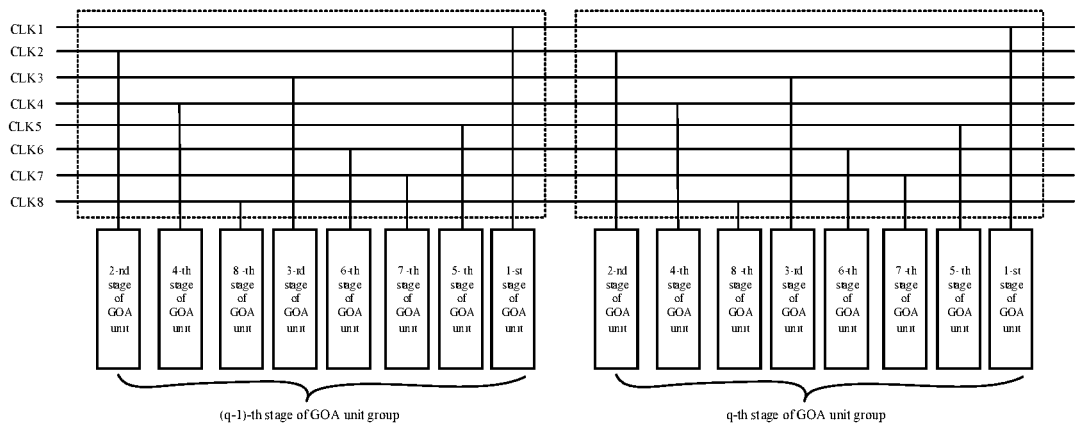
FIG. 8 illustrates a schematic diagram of the connection relationship between the shift register unit groups and the clock signal lines in a display panel according to one embodiment of the present disclosure.

The p-th stage of the shift register units in each column of the shift register unit groups in each gate drive circuit is connected with the p-th row of the clock signal lines. That is, as shown in FIG. 8, the 1-st stage of the shift register units is connected with the 1-st row of the clock signal lines, the 2-nd stage of the shift register units is connected with the 2-nd row of the clock signal lines, . . . , the 7-th stage of the shift register units is connected with the 7-th row of the clock signal lines, and the 8-th stage of the shift register units is connected with the 8-th row of the clock signal lines.

It should be noted that, in an embodiment of the present disclosure, the connection relationship between each row of the shift register unit groups and the CLK routings is not changed, ensuring that the charging timing sequence is not confused, and only the sequence of each stage of the shift register units in each column of the shift register unit groups is disordered. As shown in FIG. 8, an 8-CLKs full-screen panel is used as an example.

Each gate drive circuit corresponds to 8 rows of the CLKs, which are CLK1, CLK2, CLK3, CLK4, CLK5, CLK6, CLK7, and CLK8. In each column of the shift register unit groups in each gate drive circuit, the 1-st stage of the shift register units (e.g., the (q−1)-th column of the shift register unit groups or the q-th column of the shift register unit groups as shown in FIG. 8) is connected with CLK1, the 2-nd stage of the shift register units is connected with CLK2, . . . , the 7-th stage of the shift register units is connected with CLK7, and the 8-th stage of the shift register units is connected with CLK 8.

Figure 9:
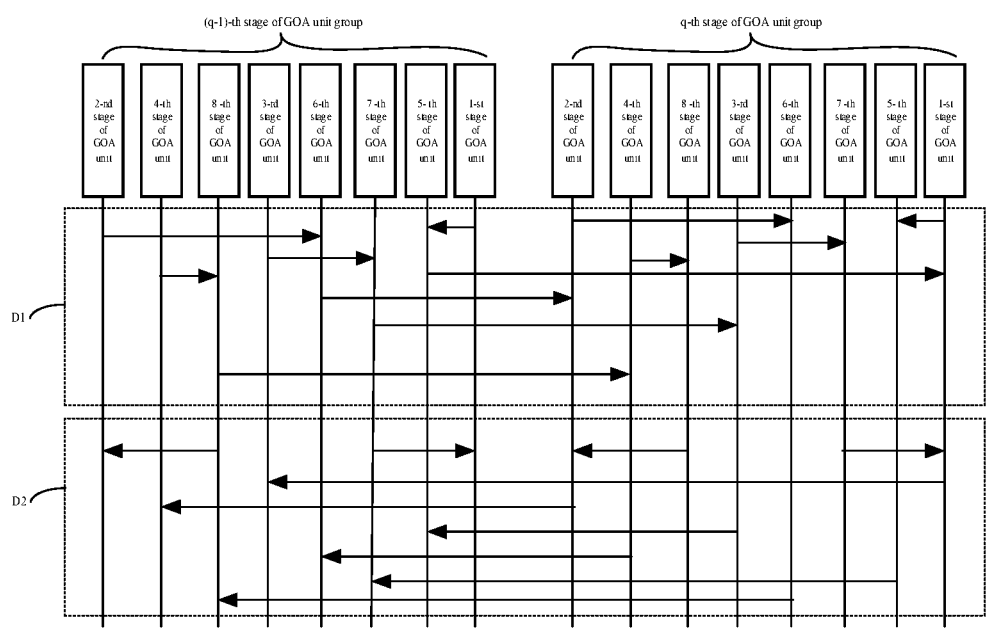
FIG. 9 illustrates a schematic diagram of the cascaded relationship of each shift register unit group in a display panel according to one embodiment of the present disclosure.

In addition, in an embodiment of the present disclosure, the cascaded way becomes relatively complex when the order of each stage of the shift register units in each column of the shift register unit groups is disturbed. As shown in FIG. 9, an 8-CLKs full-screen panel is used as an example. In the (q−1)-th stage of the shift register unit groups in each gate drive circuit, the output end of the ($p_1$−4)-th stage of the shift register units is connected with the input end of the p-th stage of the shift register units. It should be noted that, 5≤p1≤P and P is equal to 8. That is, in the (q−1)-th stage of the register unit groups, the output end of the 1-st stage of the shift register units is connected with the input end of the 5-th stage of the shift register units, the output end of the 2-nd stage of the shift register units is connected with the input end of the 6-th stage of the shift register units, the output end of the 3-rd stage of the shift register units is connected with the input end of the 7-th stage of the shift register units, and the output end of the 4-th stage of the shift register units is connected with the input end of the 8-th stage of the shift register units, as shown in the dashed block D1 in FIG. 9. Further, the output end of the ($n_1$+4)-th stage of the shift register units in the (q−1)-th stage of the shift register unit groups is connected with the input end of the $n_1$-th stage of the shift register units in the q-th stage of the shift register unit groups. It should be noted that 1≤$n_1$≤4 and $n_1$ is a positive integer. That is, the output end of the 5-th stage of the shift register units in the (q−1)-th stage of the shift register unit groups is connected with the input end of the 1-st stage of the shift register units in the q-th stage of the shift register unit groups. The output end of the 6-th stage of the shift register units in the (q−1)-th stage of the shift register unit groups is connected with the input end of the 2-nd stage of the shift register units in the q-th stage of the shift register unit groups. The output end of the 7-th stage of the shift register units in the (q−1)-th stage of the shift register unit groups is connected with the input end of the 3-rd stage of the shift register units in the q-th stage of the shift register unit groups. The output end of the 8-th stage of the shift register units in the (q−1)-th stage of the shift register unit groups is connected with the input end of the 4-th stage of the shift register units in the q-th stage of the shift register unit groups. This is as shown by the dashed block D1 in FIG. 9.

In each gate drive circuit, the output end of the $p_2$-th stage of the shift register units in the (q−1)-th stage of the shift register unit groups is connected with the reset end of the ($p_2$−6)-th stage of the shift register units. It should be noted that 7≤$p_2$≤P and P is equal to 8. That is, the output end of the 7-th stage of the shift register units in the (q−1)-th stage of the shift register unit groups is connected with the reset end of the 1-st stage of the shift register units, and the output end of the 8-th stage of the shift register units in the (q−1)-th stage of the shift register unit groups is connected with the reset end of the 2-nd stage of the shift register units. This is as shown by the dashed block D2 in FIG. 9. The output end of the $n_2$-th stage of the shift register units in the q-th stage of the shift register unit groups is connected with the reset end of the ($n_2$+2)-th stage of the shift register units in the (q−1)-th stage of the shift register unit groups. It should be noted that 1≤$n_2$≤6 and $n_2$ is a positive integer. That is, the output end of the 1-st stage of the shift register units in the q-th stage of the shift register unit groups is connected with the reset end of the 3-rd stage of the shift register units in the (q−1)-th stage of the shift register unit groups. The output end of the 2-nd stage of the shift register units in the q-th stage of the shift register unit groups is connected with the reset end of the 4-th stage of the shift register units in the (q−1)-th stage of the shift register unit groups. The output end of the 3-rd stage of the shift register units in the q-th stage of the shift register unit groups is connected with the reset end of the 5-th stage of the shift register units in the (q−1)-th stage of the shift register unit groups. The output end of the 4-th stage of the shift register units in the q-th stage of the shift register unit groups is connected with the reset end of the 6-th stage of the shift register units in the (q−1)-th stage of the shift register unit groups. The output end of the 5-th stage of the shift register units in the q-th stage of the shift register unit groups is connected with the reset end of the 7-th of the stage shift register units in the (q−1)-th stage of the shift register unit groups. The output end of the 6-th stage of the shift register units in the q-th stage of the shift register unit groups is connected with the reset end of the 8-th stage of the shift register units in the (q−1)-th stage of the shift register unit groups. This is as shown by the dashed block D2 in FIG. 9.

It should be noted that, the CLKs according to an embodiment of the present disclosure are not limited to the 8 rows shown in the figure, and the number may be less or more, which depends on the specific situation. Further, the number of the shift register units in each shift register unit group is not limited to 8, and may be less or more, which depends on the specific situation. Besides, the cascaded relation of the shift register units is not limited to the above-mentioned relation, and may be other relations, which depends on the specific situation.

It should be understood that, the display panel according to an embodiment of the present disclosure is not limited to including only the aforementioned second scanning lines, the first scanning lines, the data lines, the gate drive circuit, and the source drive circuit, and may further include a plurality of pixel units, second common lines, and first common lines in the display area.

For example, the display panel according to an embodiment of the present disclosure may be a liquid crystal display panel, which mainly includes an array substrate and a counter substrate disposed in alignment with and opposite to each other, and liquid crystal molecules located between the array substrate and the counter substrate. The aforementioned gate drive circuit and source drive circuit may be integrated in the non-display area of the array substrate, or connected with the non-display area of the array substrate through a COF. Further, the aforementioned pixel units, second scanning lines, first scanning lines, data lines, second common lines and first common lines may be located in the display area of the array substrate.

The structure of the array substrate according to an embodiment of the present disclosure may be described in detail below in conjunction with the accompanying drawings.

In an embodiment of the present disclosure, the array substrate may include a first base substrate 20 and pixel units disposed on the first base substrate 20, a first scanning line 23 and a second scanning line 24, a data line 25, a first common line 26, and a second common line 27. It should be noted that, the pixel units, the first scanning line 23, the second scanning line 24, the data line 25, the first common line 26, the second common line 27 are structures located in the display area of the array substrate. In addition, it should be understood that, the first scanning line 23 mentioned here is the aforementioned H Gate, and the second scanning line 24 may be the aforementioned V Gate.

As shown in conjunction with FIGS. 10 to 13, the first base substrate 20 may be a single-layer structure. For example, the first base substrate 20 may be a glass substrate, but is not limited thereto, and may also be a substrate made of other materials. In addition, the first base substrate 20 may also be a multi-layer structure, which depends on the specific situation.

In an embodiment of the present disclosure, as shown in conjunction with FIGS. 10 to 13, the first base substrate 20 may have a plurality of pixel regions arranged in an array along the row direction X and the column direction Y, a plurality of columns of first wiring areas arranged in the row direction X, and a plurality of rows of second wiring areas 204 arranged in the column direction Y. Each pixel region includes at least two sub-pixel regions 200 arranged at intervals in the row direction X. Each column of the first wiring areas and each column of the pixel regions are alternately arranged along the row direction X. A part of the plurality of columns of the first wiring areas is defined as a first sub-wiring area 201, and another part thereof is defined as a second sub-wiring area 202. Each row of the second wiring areas 204 and each row of the pixel regions are alternately arranged along the column direction Y. It should be noted that, a third wiring area 203 may be further disposed between two adjacent columns of the sub-pixel regions 200 in each column of the pixel regions. It should be understood that, the first sub-wiring area 201, the second sub-wiring area 202, and the third wiring area 203 extend in the column direction Y as a whole. The second wiring area 204 extends in the row direction X as a whole. It is therefore known that there are overlapping areas between the second wiring area 204, and the first sub-wiring area 201, the second sub-wiring area 202, the third wiring area 203.

Figure 10:
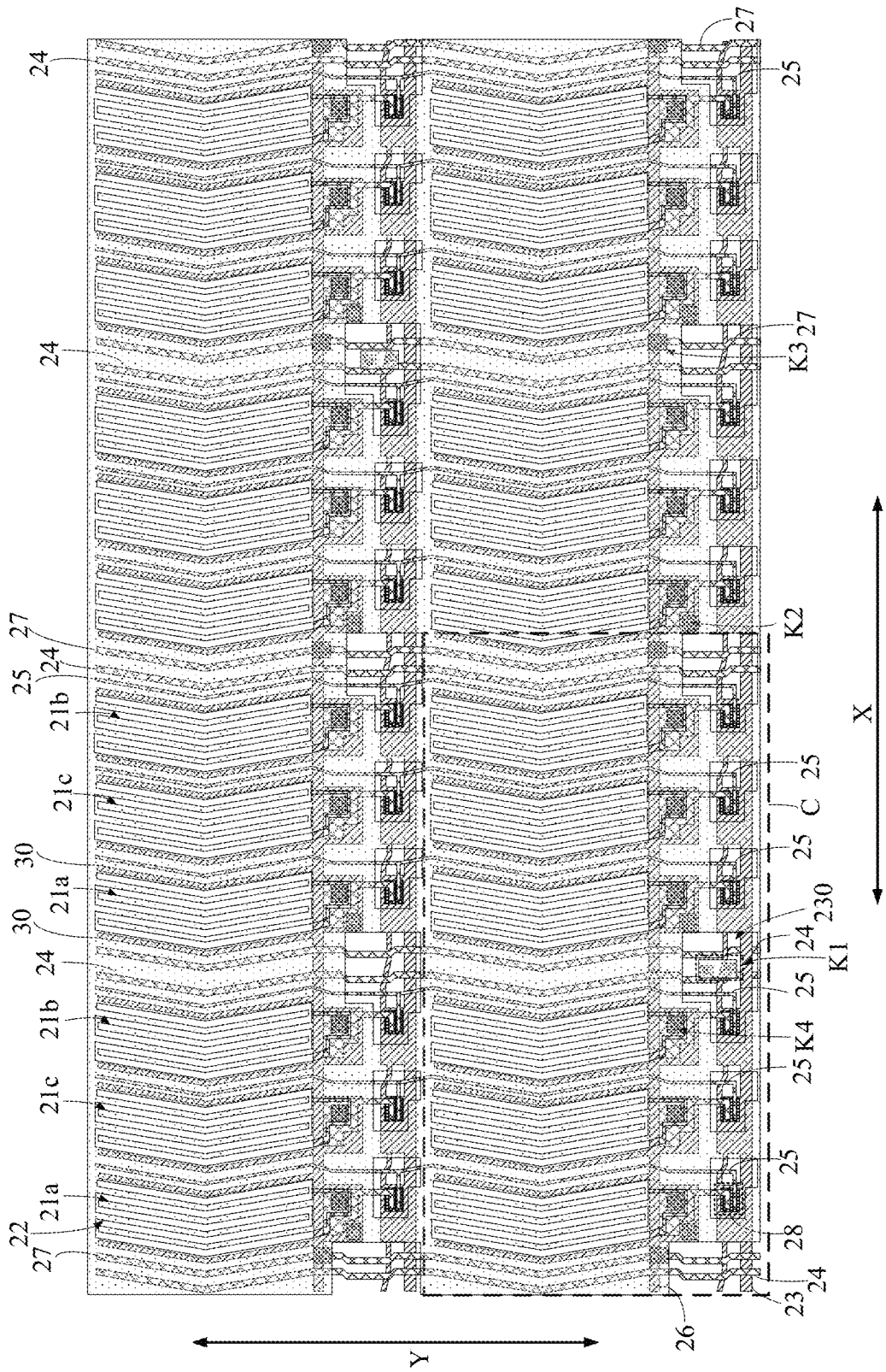
FIG. 10 is a structural schematic diagram of an array substrate described in one embodiment of the present disclosure.

As shown in FIG. 10, a plurality of pixel units may be provided, and the plurality of pixel units may be arranged in an array along the row direction X and the column direction Y on the first base substrate. It should be noted that, each pixel unit may include at least two sub-pixels arranged in the row direction X. The number of the sub-pixels in each pixel unit is equal to the number of the sub-pixel regions 200. Each sub-pixel in each pixel unit corresponds to a respective sub-pixel region 200 in each pixel region. In addition, the number of columns of the pixel units may be equal to the number of columns of the first wiring areas, and the number of rows of the pixel units may be equal to the number of rows of the second wiring areas 204.

For example, each pixel unit may include three sub-pixels, respectively a red sub-pixel, a green sub-pixel, and a blue sub-pixel, arranged sequentially in the row direction. Among two adjacent pixel units in the row direction X, the red sub-pixel of one pixel unit is adjacent to the blue sub-pixel of the other pixel unit.

It should be understood that, the red sub-pixel as mentioned in an embodiment of the present disclosure refers to a sub-pixel corresponding to a red light filtering unit. That is, the red sub-pixel may be used for driving the liquid crystal molecules corresponding to the red light filtering unit to deflect, so that light emitted by the backlight source may be emitted through the red light filtering unit. Similarly, the blue sub-pixel refers to a sub-pixel corresponding to the blue light filtering unit. That is, the blue sub-pixel may be used for driving the liquid crystal molecules corresponding to the blue light filtering unit to deflect, so that light emitted by the backlight source may be emitted through the blue light filtering unit. The green sub-pixel refers to a sub-pixel corresponding to the green light filtering unit. That is, the green sub-pixel may be used for driving liquid crystal molecules corresponding to the green light filtering unit to deflect, so that light emitted by the backlight source may be emitted through the green light filtering unit.

In other words, each pixel unit may include at least two sub-pixels spaced in the row direction X. Specifically, it may include three sub-pixels corresponding to the red, green, and blue light filtering units. But it should be noted that the pixel units in an embodiment of the present disclosure are not limited to the aforementioned three sub-pixels, and more sub-pixels may be provided, for example, four, etc. Besides, the colors corresponding to the sub-pixels are not limited to the aforementioned red, green, and blue, but may also be other colors, such as white, yellow, etc., which depends on the specific situation.

In an embodiment of the present disclosure, each sub-pixel may include sub-pixel electrodes 21a, 21b, 21c, a common electrode 22, and a transistor 28.

The sub-pixel electrodes 21a, 21b, 21c may have a plurality of first electrode strips 210 arranged at intervals in the row direction X, and the first electrode strips 210 may be disposed on the sub-pixel regions 200. It should be understood that, the sub-pixel electrodes 21a, 21b, 21c may further include a first conductive connection portion 211 located on the same side of each of the first electrode strips 210 and connected with each of the first electrode strips 210. That is, the sub-pixel electrodes 21a, 21b, 21c as a whole may have a "comb" shape, and the first conductive connection portion 211 may be disposed at the second wiring area 204.

Figure 11:
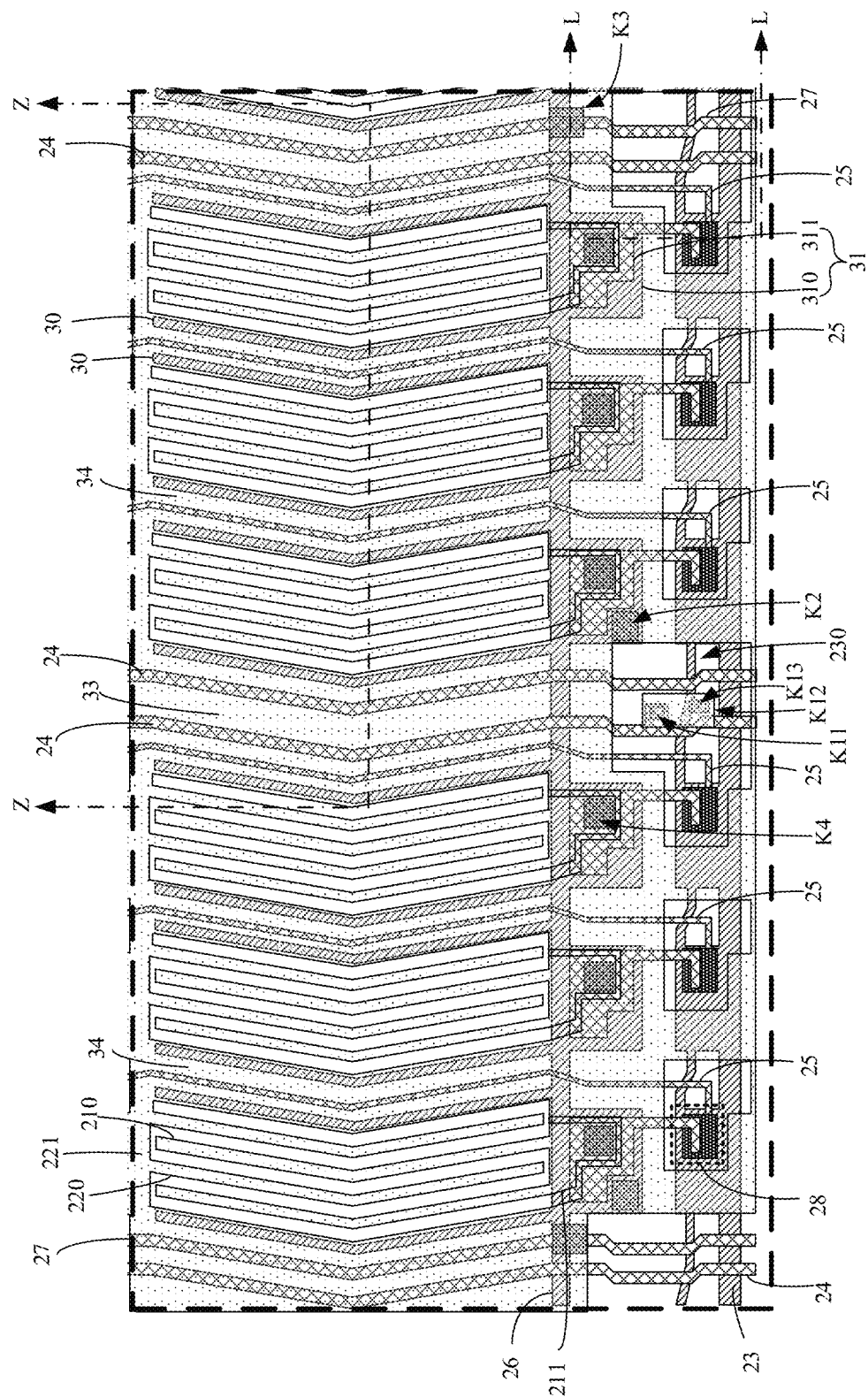
FIG. 11 is an enlarged structural schematic diagram of the C part in an array substrate shown in FIG. 6.
Figure 12:
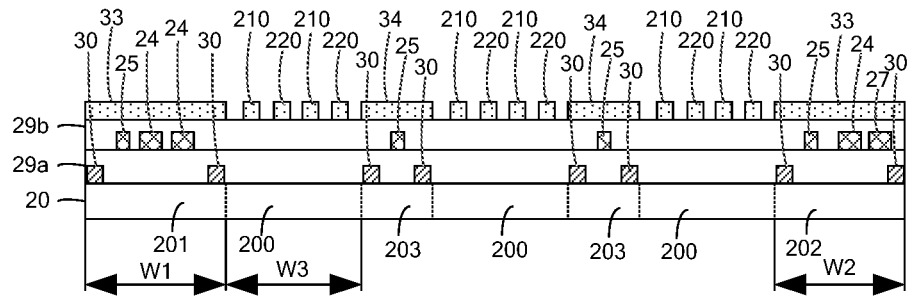
FIG. 12 is a cross-sectional structural schematic diagram of an array substrate along the Z-Z line shown in FIG. 11.
Figure 14:
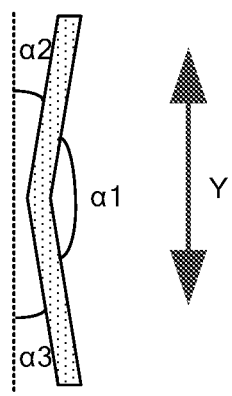
FIG. 14 is a structural schematic diagram of the first electrode strips in an array substrate shown in FIG. 10.

As shown in conjunction with FIGS. 10, 11 and 14, the first electrode strip 210 may be bent in its entirety with a bending angle α1 being from 50° to 170°. Specifically, the first electrode strip 210 may include two parts, and the included angle α1 between the two parts is from 150° to 160°; such as 150°, 156°, 162°, 166°, 170°, etc. In other words, the included angles α2 and α3 between the extending directions of the two parts and the column direction Y are from 5° to 15°, respectively, such as 5°, 7°, 9°, 12°, 15°, etc.

It should be noted that, the sub-pixel electrode in the red sub-pixel may be defined as a red sub-pixel electrode 21a, the sub-pixel electrode in the blue sub-pixel may be defined as a blue sub-pixel electrode 21b, and the sub-pixel electrode in the green sub-pixel may be defined as a green sub-pixel electrode 21c. Each of the red sub-pixel electrode 21a, the blue sub-pixel electrode 21b, and the green sub-pixel electrode 21c has a plurality of first electrode strips 210 arranged at intervals in the row direction X. It should be understood that the red sub-pixel electrode 21a, the blue sub-pixel electrode 21b, and the green sub-pixel electrode 21c have the same structure. For example, the number of strips, size, shape, gap, etc. of the first electrode strips 210 are the same, and the shape and size of the first conductive connection portions 211 and their relative positions to the first electrode strips 210 are the same.

As shown in FIGS. 10 and 11, the common electrode 22 may be disposed in the same layer as the sub-pixel electrodes 21a, 21b, 21c. For example, the aforementioned common electrode 22 and the sub-pixel electrodes 21a, 21b, 21c may be transparent electrodes. The common electrode 22 and the sub-pixel electrodes 21a, 21b, 21c may be made of indium tin oxide (ITO), but are not limited thereto, and they may also be made of indium zinc oxide (IZO), etc. It should be understood that the common electrode 22 and the sub-pixel electrodes 21a, 21b, 21c have gaps there between (e.g., no contact).

Specifically, the common electrode 22 may have a plurality of second electrode strips 220, and the second electrode strips 220 may be located in the sub-pixel regions 200. The common electrode 22 may further have a second conductive connection portion 221 for connecting the second electrode strips 220. The second conductive connection portion 221 may be located in the second wiring area 204. The second electrode strips 220 of the common electrode 22 and the first electrode strips 210 are alternately arranged in the row direction X. That is, the sub-pixel electrode and the common electrode 22 may be in an inter-inserted state. In other words, the array substrate according to an embodiment of the present disclosure may be in the In-panel Switching (IPS) mode, so that the parasitic capacitance generated between the sub-pixel electrode and the common electrode may be reduced, and the pixel charging rate and the aperture ratio may be improved. But the present disclosure is not limited thereto. The common electrode 22 and the sub-pixel electrode may also be located on different layers of the array substrate and disposed opposite to each other, wherein one of the common electrode 22 and the sub-pixel electrode is a slit electrode having a slit, and the other one is a plate electrode without slit. That is, the array substrate according to an embodiment of the present disclosure may also be in Fringe Field Switching (FFS) mode, which depends on the specific situation.

It should be noted that, the common electrode 22 of each sub-pixel may be integrally connected with each other.

Figure 15:
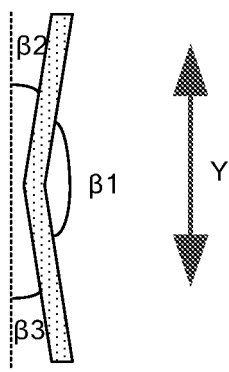
FIG. 15 is a structural schematic diagram of the second electrode strips in an array substrate shown in FIG. 10.

In an embodiment of the present disclosure, as shown in conjunction with FIGS. 10, 11 and 15, the second electrode strip 220 may be bent in its entirety with a bending angle β1 from 150° to 170°. Specifically, the second electrode strip 220 may include two parts, and the included angle β1 between the two parts is from 150° to 160°, such as 150°, 156°, 162°, 166°, 170°, etc. In other words, the included angles β2 and β3 between the extending directions of the two parts and the column direction Y are from 5° to 15°, respectively, such as 5°, 7°, 9°, 12°, 15°, etc.

The second electrode strip 220 and the first electrode strip 210 may be substantially parallel. That is, the bending angle β1 of the second electrode strip 220 may be the same as the bending angle α1 of the first electrode strip 210.

In view of above, the first electrode strip 210 of the sub-pixel electrode and the second electrode strip 220 of the common electrode 22 are arranged in a bent shape and the bending angle thereof are chosen to be from 150° to 170°, such that the color shift may be reduced, and the display effect may be improved.

It should be noted that, the first electrode strip 210 and the second electrode strip 220 in each sub-pixel are not limited to the aforementioned alternative arrangement in the row direction X, but may also be alternative arrangement in the column direction Y, which depends on the actual requirement.

It should additionally be noted that, when the first electrode strip 210 and the second electrode strip 220 are in the aforementioned bent shape, the whole sub-pixel region 200 may also be in the same bent shape as the first electrode strip 210, and the first sub-wiring area 201, the second sub-wiring area 202, and the third sub-wiring area 203 as a whole may also be in the same bent shape as the first electrode strip 210, so that the sub-pixel electrodes in the array substrate may be arranged in a more dense way. The overall shape of the second wiring area 204 may be adapted to the shape of the signal line (e.g., the first scanning line 23, the first common line 26) thereon.

Figure 13:
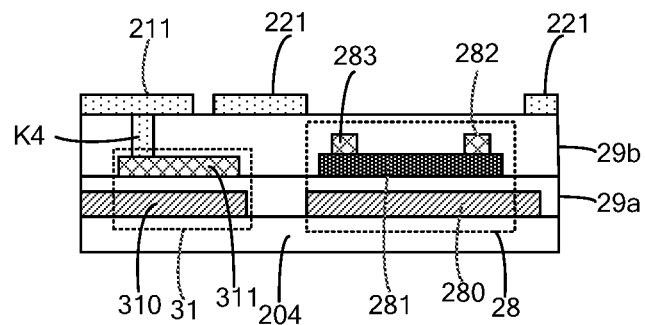
FIG. 13 is a cross-sectional structural schematic diagram of an array substrate along the L-L line shown in FIG. 11.

In conjunction with FIG. 10, FIG. 11, and FIG. 13, it may be seen that the transistor 28 of each sub-pixel may be located in the second wiring area 204. It should be understood that, the transistor 28 may be entirely located on the side of the sub-pixel electrodes 21a, 21b, 21c and the common electrode 22 close to the first base substrate 20. That is, the transistor 28 may be formed on the first base substrate 20 before the sub-pixel electrodes and the common electrode 22. As shown in FIGS. 10 and 11, each transistor 28 may be connected with one sub-pixel electrode. But the present disclosure is not limited thereto. One transistor 28 may be connected with a plurality of sub-pixel electrodes, or one sub-pixel electrode may be connected with a plurality of transistors 28, etc., which depends on the specific situation.

Specifically, as shown in conjunction with FIGS. 10, 11 and 13, the transistor 28 includes a gate 280, an active layer 281, and a first terminal 282 and a second terminal 283 being in the same layer. The first terminal 282 is connected with one end of the active layer 281. The second terminal 283 is connected with the other end of the active layer 281. The second terminal 283 may be connected with the sub-pixel electrode through a fourth through-hole structure K4, and in particular may be connected with the first conductive connection portion 211 of the sub-pixel electrode through the fourth through-hole structure K4. It should be understood that, one of the first terminal 282 and the second terminal 283 may be a source and the other may be a drain, and the fourth through-hole structure K4 may be located in the second wiring area 204.

In an embodiment of the present disclosure, the aforementioned gate 280, first terminal 282 and second terminal 283 may be made of metal materials. For example, they may be made of metal materials such as aluminum, molybdenum, and the like. The gate 280, the first terminal 282, and the second terminal 283 may be a composite layer structure or a single-layer structure, which depends on the specific situation.

As shown in FIG. 13, the transistor 28 according to an embodiment of the present disclosure may be a bottom gate type. That is, the active layer 281 is located on the side of the gate 280 away from the first base substrate 20. It is understood that, a gate insulation layer 29a may be formed between the active layer 281 and the gate 280. That is, in the manufacturing process of the array substrate, the gate 280 may be firstly formed on the first base substrate 20; and then, the gate insulation layer 29a covering the gate 280 is formed. After that, the active layer 281 facing the gate 280 is formed on the gate insulation layer 29a. It should be noted that, the whole gate insulation layer 29a is disposed on the first base substrate 20. That is, the gate insulation layer 29a may cover not only the gate 280 but also other structures that are formed before the gate insulation layer 29a. It should be understood that, the gate insulation layer 29a may be made of inorganic materials, for example, silicon oxide, silicon oxynitride, and the like.

The aforementioned transistor 28 may be formed on the first base substrate 20 before the sub-pixel electrode is formed. That is, in the manufacturing process of the array substrate, the transistor 28 may be firstly formed on the first base substrate 20, and then, the sub-pixel electrode and the common electrode 22 are formed. It should be noted that, after the first terminal 282 and the second terminal 283 of the transistor 28 are formed on the first base substrate 20, and before the sub-pixel electrode and the common electrode 22 are formed, a passivation layer 29*b* may be further formed. As shown in FIG. 13, the passivation layer 29*b* covers the first terminal 282 and the second terminal 283, and the first conductive connection portion 211 of the sub-pixel electrode may be connected with the second terminal 283 through the fourth through-hole structure K4 penetrating through the passivation layer 29*b*.

The whole passivation layer 29*b* is disposed in each area of the first base substrate 20. That is, the passivation layer 29*b* covers not only the first terminal 282 and the second terminal 283, but also other structures formed on the first base substrate 20 before the passivation layer 29*b*. It should be understood that, the passivation layer 29*b* may be made of inorganic materials, for example, silicon oxide, silicon oxynitride, and the like.

An organic insulation layer (not shown) may be further formed between the passivation layer 29*b* and the sub-pixel electrode. That is, in the manufacturing process of the array substrate, the passivation layer 29*b* may be firstly formed on the first base substrate 20, and then, the organic insulation layer is formed on the passivation layer 29*b*. After that, the sub-pixel electrode is formed on the organic insulation layer. The first conductive connection portion 211 of the sub-pixel electrode may be connected with the second terminal 283 through the fourth through-hole structure K4 penetrating through the organic insulation layer and the passivation layer 29*b*.

In an embodiment of the present disclosure, planarization is achieved by disposing the organic insulating layer, so that the distance between the layers where the sub-pixel electrode and the second pole 283 are located may be increased, while the subsequent coating of the sub-pixel electrode material is facilitated. Thus, the sub-pixel electrode may be prevented from being interfered by a signal line on the layer where the second terminal 283 is located.

It should be noted that the array substrate according to an embodiment of the present disclosure may not be provided with the organic insulation layer.

A color filter layer (not shown) may be further formed between the passivation layer 29*b* and the organic insulation layer. That is, in the manufacturing process of the array substrate, the passivation layer 29*b* may be firstly formed on the first base substrate 20, and then, the color filter layer is formed on the passivation layer 29*b*. After that, the organic insulation layer is formed on the color filter layer. The first conductive connection portion 211 of the sub-pixel electrode may be connected with the second terminal 283 through the fourth through-hole structure K4 penetrating through the organic insulation layer, the color filter layer, and the passivation layer 29*b*. For example, the color filter layer may include the aforementioned red light, green light, and blue light filtering units, etc.

It should be noted that, the array substrate according to an embodiment of the present disclosure may not be provided with a color filter layer, and the color filter layer may be provided on the counter substrate.

In addition, the transistor 28 according to an embodiment of the present disclosure is not limited to the bottom gate type, and it may be a top gate type, which depends on the specific situation.

As shown in FIG. 10, a plurality of rows of the first scanning lines 23 may be provided and arranged sequentially on the first base substrate 20 in the column direction Y. The first scanning lines 23 may be located in the second wiring area 204. The first scanning lines 23 may be formed between the first base substrate 20 and the common electrode 22. That is, in the manufacturing process of the array substrate, the first scanning lines 23 may be firstly formed on the first base substrate 20, and then the common electrode 22 and the sub-pixel electrode are formed. For example, the first scanning lines 23 and the gate 280 of the transistor 28 may be disposed in the same layer as and connected with each other. It should be understood that the gate 280 of the transistor 28 and the first scanning lines 23 may be formed in an integrated structure.

In an embodiment of the present disclosure, at least one row of the first scanning lines 23 may be disposed on each row of the second wiring area 204. In other words, at least one row of the first scanning lines 23 may be disposed on a side in the column direction Y of each row of the pixel units. For example, each row of the second wiring area 204 may be provided with one row of the first scanning line 23, where the same row of the first scanning line 23 is connected with the gates of the transistors of the sub-pixels in the same row. That is, one row of the first scanning line 23 may provide scanning signals for the sub-pixels in one row of the pixel units. But the present disclosure is not limited thereto. Two rows of the first scanning lines 23 may be also disposed between every two rows of the second wiring areas 204, which depends on the specific situation.

As shown in FIG. 10, a plurality of rows of the first common lines 26 may be provided and arranged sequentially on the first base substrate in the column direction Y. The first common lines 26 are connected with the sub-pixels for providing common signals to the sub-pixels. The first common lines 26 may be formed between the first base substrate 20 and the common electrode 22. That is, in the manufacturing process of the array substrate, the first common lines 26 may be firstly formed on the first base substrate 20, and then the common electrode 22 and the sub-pixel electrode may be formed. For example, the first common lines 26 may be in the same layer as the first scanning lines 23, and the first common lines 26 may be connected with the common electrode 22 through the second through-hole structure K2, so as to provide common signals to the common electrode 22. Specifically, the first common lines 26 may be connected with the second conductive connection portion 221 of the common electrode 22 through the second through-hole structure K2. It should be noted that the second through-hole structure K2 may be located in the second wiring area 204.

In an embodiment of the present disclosure, at least one row of the first common line 26 may be disposed on each row of the second wiring area 204. In other words, at least one row of the first common line 26 may be disposed on a side in the column direction Y of each row of the pixel units. For example, one row of the first common line 26 may be disposed in each row of the second wiring area 204. The first common line 26 of the same row is connected with the common electrodes of the same color sub-pixels in the same row through the second through-hole structure K2. For example, the first common line 26 of the same row is connected with the second conductive connection portions 221 of the common electrodes 22 of the red sub-pixels in the same row through the second through-hole structures K2.

When the first common line 26 is connected with the common electrode 22 through the second through-hole structure K2, the second through-hole structure K2 as mentioned here may penetrate through at least the aforementioned gate insulation layer 29*a* and passivation layer 29*b*. Optionally, when the array substrate includes the aforementioned organic insulation layer and color filter layer, the second through-hole structure K2 as mentioned here may also penetrate through the organic insulation layer and the color filter layer.

In view of above, a row of the first scanning line 23 and a row of the first common line 26 may be disposed in each row of the second wiring area 204. It should be understood that there is no connection between the first common line 26 and the first scanning line 23.

As shown in FIG. 10, a plurality of columns of the second common lines 27 may be provided and arranged sequentially on the first base substrate 20 in the row direction X. The second common lines 27 may be formed between the first base substrate 20 and the common electrode 22. That is, in the manufacturing process of the array substrate, the second common lines 27 may be firstly formed on the first base substrate 20, and then the common electrode 22 and the sub-pixel electrode may be formed. The aforementioned passivation layer 29b may be formed between the second common lines 27, and the common electrode 22 and the sub-pixel electrode.

For example, the second common lines 27 may be in the same layer as the first terminal 282 and the second terminal 283 of the transistor 28. The aforementioned first common lines 26 may be disposed in the same layer as the first scanning line 23, and the first scanning line 23 may be disposed in the same layer as the gate 280 of the transistor 28. Thus, it may be understood that the second common lines 27 according to an embodiment of the present disclosure are formed after the first common lines 26. It should be noted that, the aforementioned gate insulation layer 29a is formed between the second common lines 27 and the first common lines 26.

In an embodiment of the present disclosure, the second common line 27 may be connected with the common electrode 22 through a third through-hole structure K3. Specifically, as shown in FIG. 10, when the second common line 27 is connected with the common electrode 22 through the third through-hole structure K3, the third through-hole structure K3 as mentioned here may penetrate through at least the passivation layer 29b mentioned above. Further, when the array substrate includes the aforementioned organic insulation layer and color filter layer, the third through-hole structure K3 as mentioned here may also penetrate through the organic insulation layer and the color filter layer. It should be noted that, the third through-hole structure K3 may be located in the second wiring area 204, and the second common line 27 may be connected with the second conductive connection portion 221 of the common electrode 22 through the third through-hole structure K3.

At least one of the first common line 26 and the second common line 27 has a common signal input end to provide a common signal for the common electrode 22. Optionally, the second common line 27 may have a common signal input end, and the second common line 27 may transmit the received common signal to the first common line 26 and the common electrode 22, but the present disclosure is not limited thereto. The first common line 26 and the second common line 27 may each have a common signal input end.

In an embodiment of the present disclosure, one column of the second common line 27 may be disposed in each column of the second sub-wiring area 202. For example, the shape of the part of the second common line 27 opposite to the first electrode strip 210 in the row direction X may match the shape of the first electrode strip 210. That is, when the first electrode strip 210 is in a bent shape, the part of the second common line 27 opposite to the first electrode strip 210 in the row direction X may also in a bent shape and may be substantially parallel to the first electrode strip 210.

It should be understood that, only the first common line 26 or only the second common line 27 may be provided in an embodiment of the present disclosure, which depends on the specific situation.

As shown in FIG. 10, a plurality of columns of the second scanning lines 24 may be provided and arranged sequentially on the first base substrate 20 in the row direction X. For example, the second scanning lines 24 may be formed between the first base substrate 20 and the common electrode 22. That is, in the manufacturing process of the array substrate, the second scanning lines 24 may be firstly formed on the first base substrate 20, and then the common electrode 22 and the sub-pixel electrode are formed. For example, the second scanning lines 24 may be disposed in the same layer as the first terminal 282 and the second terminal 283 of the transistor 28. It should be understood that, there is a gap (e.g., no contact) between the second scanning lines 24 and the first and second terminals 282, 283 of the transistor 28.

As shown in FIG. 10, at least one column of the second scanning line 24 is disposed in each column of the first wiring area. In other words, at least one column of the second scanning line 24 is disposed on a side in the row direction X of each row of the pixel units. It should be noted that, as mentioned above, among two adjacent pixel units in the row direction X, the red sub-pixel of one pixel unit is adjacent to the blue sub-pixel of the other pixel unit. Therefore, it is understood that, the second scanning line 24 according to an embodiment of the present disclosure may be located between the red sub-pixels and the blue sub-pixels in two adjacent columns.

For example, the shape of the part of the second scanning line 24 opposite to the first electrode strip 210 in the row direction X may match the shape of the first electrode strip 210. That is, when the first electrode strip 210 is in a bent shape, the part of the second scanning line 24 opposite to the first electrode strip 210 in the row direction X may also in a bent shape and parallel to the first electrode strip 210.

In an embodiment of the present disclosure, the second scanning line 24 is connected with a row of the first scanning line 23 through the first through-hole structure K1. The second scanning line 24 has a scanning signal input end, and a scanning signal received by the second scanning line 24 may be transmitted to the gate 280 of the respective transistor 28 through the first through-hole structure K1 and the first scanning line 23 in sequence, thereby controlling the transistor 28 to switch on/off.

The plurality of the first through-hole structures K1 according to an embodiment of the present disclosure may be divided into a first group and a second group. The number of the first through-hole structures K1 in the first group is equal to that of the shift register units in the aforementioned first gate drive circuit, and each of the first through-hole structures K1 in the first group is connected with a respective one of the shift register units in the aforementioned first gate drive circuit. The number of the first through-hole structures K1 in the second group is equal to that of the shift register units in the second gate drive circuit, and each of the first through-hole structures K1 in the second group is connected with a respective one of the shift register units in the aforementioned second gate drive circuit.

It should be noted that, the distance between the first through-hole structures K1 located in the same row in the first group and the second group is a through-hole distance. The first through-hole structures located in the same row in the first and second groups refer to the first through-hole structures K1, connected with the same row of the first scanning line 23, in the first and second groups.

Optionally, the first group and the second group may be axisymmetric to reduce the scheme difficulty. Each column of the second scanning line groups as mentioned above includes a column of the second scanning line. Each row of the first scanning line groups includes a row of the first scanning line. Each column of the shift register unit groups in each gate drive circuit includes a column of the shift register units. The column of the shift register units being connected with a row of the first scanning line through a column of the second scanning line is used as an example. In the direction from the upper side to the lower side of the display panel, the through-hole distance of each row in the first and second groups is gradually reduced.

However, it should be noted that, in an embodiment of the present disclosure, the first group and the second group are not limited to be axisymmetric, and the through-hole distance of each row in the first and second groups may also be equal, so that the scheme difficulty may also be reduced.

Optionally, the first through-hole structure K1 may include a first through-hole portion K11 and a connection portion K12. The connection portion K12 and the second scanning line 24 are located on different layers of the array substrate. A part of the connection portion K12 is connected with the first scanning line 23, and a part of the connection portion K12 is connected with the second scanning line 24 through the first through-hole portion K11.

Further, the connection portion K12 is disposed in the same layer as the common electrode 22 and the sub-pixel electrode, and a gap (e.g., no contact) exists between the connection portion K12, and the common electrode 22 and the sub-pixel electrode. In this case, the first through-hole structure K1 may further include a second through-hole portion K13, and the connection portion K12 may be connected with the first scanning line 23 through the second through-hole portion K13. That is, a part of the connection portion K12 may be connected with the first scanning line 23 through the second through-hole portion K13, and a part of the connection portion K12 is connected with the second scanning line 24 through the first through-hole portion K11.

It should be noted that, when the connection portion K12 is disposed in the same layer as the common electrode 22 and the sub-pixel electrode, the first through-hole portion K11 may at least penetrate through the passivation layer 29b. Further, when the array substrate includes the aforementioned organic insulation layer and color filter layer, the first through-hole portion K11 as mentioned here may also penetrate through the organic insulation layer and the color filter layer. The second through-hole portion K13 may penetrate through at least the gate insulation layer 29a and the passivation layer 29b. Further, when the array substrate includes the aforementioned organic insulation layer and color filter layer, the second through-hole portion K13 as mentioned here may also penetrate through the organic insulation layer and the color filter layer.

In an embodiment of the present disclosure, the first scanning line 23 may be provided with a plurality of hollowed-out holes 230. An orthographic projection of the aforementioned second through-hole portion K13 on the first base substrate 20 partially coincides with an orthographic projection of the first scanning line 23 on the first base substrate 20. An orthographic projection of the second through-hole portion K13 on the first base substrate 20 partially coincides with an orthographic projection of the hollowed-out holes 230 on the first base substrate 20. In this case, the parasitic capacitance generated between the connection portion K12 and the first scanning line 23 may be reduced.

It should be noted that, the aforementioned first through-hole structure K1 may be located in the second wiring area 204, where the first common line 26 may be routed at the first through-hole structure K1. That is, the aforementioned orthographic projection of the first through-hole structure K1 on the first base substrate 20 does not coincide with the orthographic projection of the first common line 26 on the first base substrate 20.

It should be understood that, the connection portion K12 is not limited to be in the same layer as the common electrode 22. For example, the connection portion K12 may be in the same layer as the first scanning line 23 and directly connected thereto. That is, there is no need to provide the aforementioned second through-hole portion K13. When the connection portion K12 may be disposed in the same layer as the first scanning line 23, the connection portion K12 may extend in the column direction as a whole, and may be located in the first wiring area between two adjacent pixel units in the row direction X.

Optionally, each row of the first scanning line 23 may be connected with two columns of the second scanning lines 24. In other words, two columns of the second scanning lines 24 are respectively connected with the same row of the first scanning line 23 through a first through-hole structure K1. That is, each row may be driven by two groups of scanning signals, which helps to enhance the scanning signals and improve the display effect. But the present disclosure is not limited thereto. Each row of the first scanning line 23 may also be connected with one column of the second scanning line 24 or with three or more columns of the second scanning lines. It should be noted that, in order to ensure the display uniformity, the number of the second scanning lines 24 connected with each row of the first scanning line 23 is consistent.

In view of above, the second scanning line 24 is disposed in the first wiring area according to an embodiment of the present disclosure. As compared with a solution where the vertical scanning line led out from the middle of the sub-pixel, an embodiment of the present disclosure may reduce the overlapping area between the second scanning line 24 and the sub-pixel electrode, so as to reduce the coupling capacitance generated between the second scanning line 24 and the sub-pixel electrode, and improve the pulling effect of the scanning signal on the pixel electrode at the second scanning line, thereby improving the Mura phenomenon and improving the product quality. It should be noted that, the coupling capacitance generated between the second scanning line 24 and the sub-pixel electrode in an embodiment of the present disclosure is negligibly small.

In addition, since the number ratio of three cone cells for sensing green, red and blue among cone cells for sensing colors is 40:20:1, the human eye is currently most sensitive to green. That is, in practical applications, red and blue have smaller effects on the transmittance of the liquid crystal display panel than green. In view of this, the present disclosure further disposes the second scanning line 24 between the adjacent red and blue sub-pixels. Even if the second scanning line 24 causes light leakage at the red and blue sub-pixels, the light leakage is not easily perceived by the human eye, and the effect is relatively small. Therefore, the width of the black matrix at such place may be reduced, or the black matrix at such place may be omitted, so as to improve the pixel aperture ratio.

In an embodiment of the present disclosure, the scanning signal provided by the second scanning line 24 is strong, and therefore, in order to ensure the display uniformity, as shown in FIG. 10, the second scanning line 24 is disposed in each column of the first sub-wiring area 201. That is, the second scanning lines 24 are arranged in the first sub-wiring area 201 and the second sub-wiring area 202. Specifically, at least one column of the second scanning line 24 is disposed in one of the first sub-wiring area 201 and the second sub-wiring area 202, and one column of the second scanning line 24 is disposed in the other of the first sub-wiring area 201 and the second sub-wiring area 202.

Optionally, two columns of the second scanning lines 24 are disposed in each column of the first sub-wiring area 201, and one column of the second scanning line 24 is disposed in each column of the second sub-wiring area 202. Two columns of the second scanning lines 24 in the same first sub-wiring area 201 are connected with the first scanning lines 23 in different rows through the first through-hole structures K1, so that the display effect is ensured, and the processing difficulty is reduced.

It should be noted that, in order to further ensure the display uniformity, the number of signal lines in the first sub-wiring area 201 may be equal to the number of signal lines in the second sub-wiring area 202. The aforementioned first sub-wiring area 201 is provided with two columns of the second scanning lines 24, and the second sub-wiring area 202 is provided with one column of the second scanning line 24. In order to make the number of signal lines in the second sub-wiring area 202 to be consistent with the number of signal lines in the first sub-wiring area 201, a row of the aforementioned second common line 27 may be disposed in each column of the second sub-wiring area 202.

A 4K resolution display panel is used as an example. The pixel units in the 4K resolution display panel have 3840 columns and 2160 rows, where each pixel unit includes a red sub-pixel, a green sub-pixel and a blue sub-pixel arranged sequentially in the row direction. Therefore, the sub-pixels in the 4K resolution display panel have 3840×3 columns and 2160 rows. That is, the first wiring area has 3840 columns, and the second wiring area 204 has 2160 rows. Each row of the second wiring area 204 is provided with one row of the first scanning line 23. That is, the first scanning line has 2160 rows. The two columns of the second scanning lines 24 as mentioned above are connected with one row of the first scanning line 23. That is, the second scanning line 24 has 2160×2 columns. T ratio between the number of columns of the first wiring areas and the number of columns of the second scanning lines 24 is 8:9. That is, every 8 columns of the first wiring areas is called a group, and there are 9 columns of the second scanning lines 24 provided in total. That is, one column of the first wiring area in each group of the first wiring areas is the first sub-wiring area 201, and the first sub-wiring area 201 is provided with two columns of the second scanning lines 24; while the remaining 7 columns of the first wiring areas are the second sub-wiring areas 202, and each column of the second sub-wiring area 202 is provided with one column of the second scanning line 24 and one column of the second common line 27.

In other words, in an embodiment of the present disclosure, the plurality of columns of the first wiring areas are divided into a plurality of columns of first wiring area groups, and each column of the first wiring area groups includes 8 columns of the first wiring areas arranged sequentially in the row direction X. That is, in each column of the first wiring area groups, the 1-st column of the first wiring areas, the 2-nd column of the first wiring areas, the 3-rd column of the first wiring areas, the 4-th column of the first wiring areas, the 5-th column of the first wiring areas, the 6-th column of the first wiring areas, the 7-th column of the first wiring areas, and the 8-th column of the first wiring areas are arranged sequentially in the row direction X. It should be noted that, the arrangement direction of the first wiring areas in each row of the first wiring area groups is the same. The n-th column of the first wiring areas in each column of the first wiring area groups is the first sub-wiring area 201, and the remaining 7 columns of the first wiring areas are the second sub-wiring areas 202, where 1≤n≤8, and n is a positive integer. That is, the first wiring areas 201 in each row of the first wiring area groups have the same number of columns.

It should be noted that, the display panel according to an embodiment of the present disclosure is not limited to the aforementioned 4K resolution, and other resolutions are also possible. Therefore, the total number of the first wiring areas, the occupation ratios of the first sub-wiring area 201 and the second sub-wiring area 202, and the position relationship between the first sub-wiring area 201 and the second sub-wiring area 202 are not limited to the aforementioned content, but may be determined according to the specific situation as long as the display uniformity of the entire panel may be ensured.

In addition, it should also be noted that, some of the second sub-wiring areas 202 in the plurality of columns of the second sub-wiring areas 202 may not be provided with the second common line 27. The second sub-wiring areas 202 without the second common line 27 may be uniformly distributed on the display panel, which depends on the actual requirements.

As shown in FIGS. 10 and 11, a plurality of columns of the data lines 25 are provided and arranged sequentially on the first base substrate 20 in the row direction X, and the data lines 25 are connected with the sub-pixels for providing data signals to the sub-pixels. For example, the data lines 25 are formed between the first base substrate 20 and the common electrode 22. That is, in the manufacturing process of the array substrate, the data lines 25 may be firstly formed on the first base substrate 20, and then the common electrode 22 and the sub-pixel electrode are formed. The data line 25 has a data signal input end, and the data line 25 is connected with the first terminal 282 of the transistor 28. That is, the data line 25 may transmit the received data signal to the first terminal 282 of the transistor 28. Optionally, the data line 25 may be disposed in the same layer as the first terminal 282 of the transistor 28.

In an embodiment of the present disclosure, the first sub-wiring area 201, the second sub-wiring area 202, and the third wiring area 203 may each be provided with at least one column of the data lines 25. In other words, each column of the sub-pixels is provided with a data line 25 on at least one side along the row direction X.

In an alternative embodiment, as shown in FIG. 10, a column of the data lines 25 is disposed on a side in the row direction X of each column of the sub-pixels, and each column of the data lines 25 and each column of the sub-pixels are alternately arranged in the row direction X. In other words, a column of the data lines 25 may be disposed in the first sub-wiring area 201, the second sub-wiring area 202, and the third wiring area 203, where each column of the data lines 25 is connected with each sub-pixel in a column of the sub-pixels adjacent to the column of the data lines 25.

Figure 16:
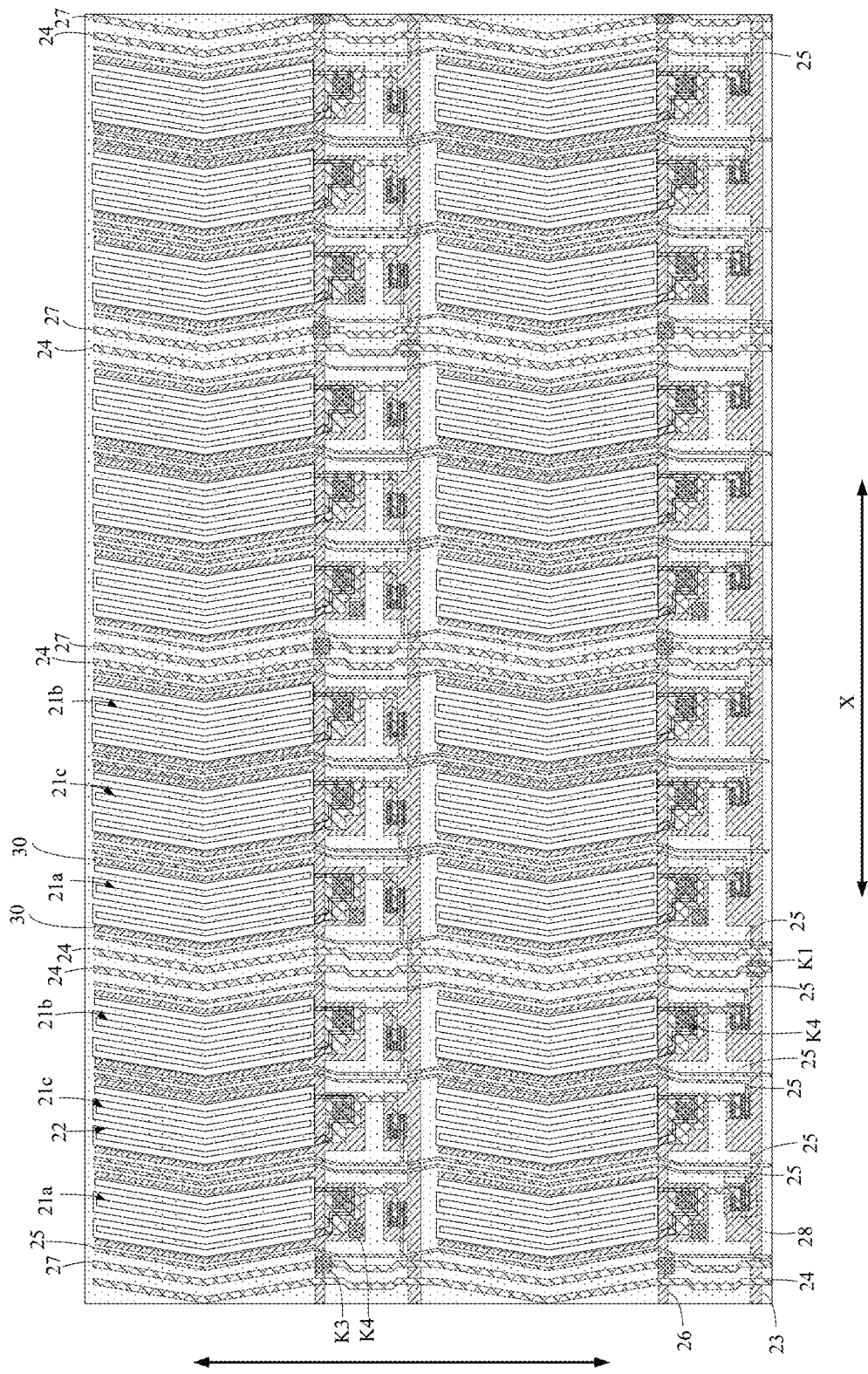
FIG. 16 is a structural schematic diagram of an array substrate described in yet another embodiment of the present disclosure.

In another alternative embodiment, as shown in FIG. 16, a column of the data lines 25 is disposed on each of the two opposite sides in the row direction X of each column of the sub-pixels. That is, two columns of the data lines 25 are disposed in the first sub-wiring area 201, the second sub-wiring area 202, and the third wiring area 203 between two adjacent columns of the sub-pixels. In each column of the sub-pixels, each sub-pixel in an even-numbered row is connected with one column of the data lines 25 located on one side of the sub-pixel and adjacent to the sub-pixel, and each sub-pixel in an odd-numbered row is connected with another column of the data lines 25 located on the other side of the sub-pixel and adjacent to the sub-pixel. That is, each column of the sub-pixels is matched and connected with two columns of the data lines 25, and the two columns of the data lines 25 are respectively located at two opposite sides in the row direction X of each column of the sub-pixels, so that the charging time may be boosted.

It should be understood that, the distances between a sub-pixel and the two columns of the data lines 25 on both sides of the sub-pixel may be equal, so that both sides of the sub-pixel is subject to the same pulling effect by the data signal. Thus, there is substantially no pressure difference generated by the data signal on both sides of the sub-pixel when the luminance is L0, such that it may be not required to consider the light leakage problem at the first sub-wiring area 201, the second sub-wiring area 202, and the third wiring area 203.

It should be noted that, whether one column of the data lines 25 or two columns of the data lines 25 are disposed in the first sub-wiring area 201 and the second sub-wiring area 202, the data lines 25 are closer to a column of the sub-pixels connected with them than the second common line 27 and the second scanning line 24.

In an embodiment of the present disclosure, the shape of the part of the data line 25 opposite to the second electrode strip 220 in the row direction X may match the shape of the second electrode strip 220. That is, when the second electrode strip 220 is in a bent shape, the part of the data line 25 opposite to the second electrode strip 220 in the row direction may also be in a bent shape, and substantially parallel to the second electrode strip 220.

In an embodiment of the present disclosure, the width of the second scanning line 24 in the row direction X may be greater than the width of the data line 25 in the row direction X. Optionally, the ratio of the width of the second scanning line 24 in the row direction X to the width of the data line 25 in the row direction X may be from 1.1 to 2, such as 1.1, 1.3, 1.5, 1.7, 2, etc. For example, the width of the data line 25 in the row direction X may be about 6 μm, and the width of the second scanning line 24 in the row direction X may be about 10 μm. But the present disclosure is not limited thereto, and they may be other values which depends on the specific situation.

Optionally, the width of the second common line 27 in the row direction X may be equal to the width of the second scanning line 24.

In an embodiment of the present disclosure, the width of the first aforementioned sub-wiring area 201 in the row direction X may be W1, the width of the second sub-wiring area 202 in the row direction X may be W2, and the width of the sub-pixel region 200 in the row direction X may be W3, where 0≤(W1−W2)/(2×W3)≤4%, and W1, W2 and W3 are positive numbers. This scheme avoids the risk of vertical strip Mura at the second scanning line 24.

Optionally, the width W1 of the first sub-wiring area 201 and the width W2 of the second sub-wiring area 202 may be equal to reduce the scheme difficulty.

In an embodiment of the present disclosure, the array substrate may further include a first cover portion 33, wherein an orthographic projection of the first cover portion 33 on the first base substrate 20 completely coincides with the first wiring area between two adjacent pixel regions, and the first cover portion 33 is disposed in the same layer as and connected with the common electrode 22 of the sub-pixel. That is, the first cover portion 33 may cover each signal line (e.g., the second scanning line 24, the data line 25, and the second common line 27) between the adjacent pixel regions to play the role of shielding signals, so as to alleviate and eliminate the effect of the signals on the electric field at the sub-pixel regions 200. Thereby, this helps to improve or eliminate problems such as light leakage at a position between the adjacent pixel regions, to reduce the area of the black matrix BM there or to eliminate the need for introducing a black matrix, and to increase the aperture ratio of the pixel.

It should be noted that, the orthographic projection of the first cover portion 33 on the first base substrate 20 does not overlap with the second wiring area 204, and the first cover portion 33 is respectively connected at two opposite sides in the column direction Y with the second conductive connection portions 221 of the common electrode 22 of two adjacent rows of sub-pixels.

In addition, the array substrate may further include a second cover portion 34, an orthographic projection of the second cover portion 34 on the first base substrate 20 completely coincides with the third wiring area 203 located between two adjacent sub-pixel regions 200 in each pixel region, and the second cover portion 34 is disposed in the same layer as and connected with the common electrode 22 of the sub-pixel. That is, the second cover portion 34 may cover a signal line (e.g., the data line 25) located between two adjacent sub-pixel regions 200 in each pixel region to play the role of shielding signals. This helps to alleviate and eliminate the effect of the signals on the electric field at the sub-pixel regions 200, thereby alleviating or eliminating problems such as light leakage at a position between two adjacent sub-pixel regions 200 in each pixel region, reducing an area of a black matrix at the position or eliminating the need for introducing a black matrix, and improving the pixel aperture ratio.

It should be noted that, the orthographic projection of the second cover portion 34 on the first base substrate 20 does not overlap with the second wiring area 204. The second cover portion 34 is respectively connected at two opposite sides in the column direction Y with the second conductive connection portions 221 of the common electrode 22 of two adjacent rows of sub-pixels.

It should be understood that, the second conductive connection portions 221 of the common electrodes 22 of adjacent sub-pixels in the row direction X are connected, and the second conductive connection portion 221 may cover a part of the second wiring area 204. Although the second conductive connection portion 221 of the common electrode 22 covers a part of the second wiring area 204 and may play the role of shielding the scanning signals on the first scanning line 23, the coupling electric field existing between the sub-pixel electrode and the first scanning line 23 may cause arrangement disorder of the liquid crystal during the display process, and therefore, the black matrix 32 is required to cover the second wiring area 204.

A metal wire 30 may be further disposed on each of the two opposite sides of each sub-pixel in the row direction X, and the metal wire 30 is disposed closer to the sub-pixel than the data line 25. The metal wire 30 according to an embodiment of the present disclosure may be disposed in the same layer as the first common line 26 and connected with the first common line 26. The metal wire 30 may play the role of shielding signals, so as to alleviate and eliminate the effect of the data signals and the scanning signal on the electric field at the sub-pixel region 200, thereby improving the display effect.

In an embodiment of the present disclosure, the aforementioned scanning signal input end of the second scanning line 24, the common signal input end of the second common line 27, and the data signal input end of the data line 25 may be located on the same side of the first base substrate 20. For example, the first base substrate 20 has a first side and a second side disposed opposite to each other in the column direction Y. The scanning signal input end of the second scanning line 24, the common signal input end of the second common line 27, and the data signal input end of the data line 25 are all close to the first side or the second side. Thus, the scanning signal input end of the second scanning line 24, the common signal input end of the second common line 27, and the data signal input end of the data line 25 are not arranged on other sides of the first base substrate 20, so that the other sides may be made to be narrow, the display area ratio may be improved, and a full-screen display may be achieved.

In addition, it should also be noted that, each through-hole structure or through-hole portion as mentioned in the present disclosure may be a structure in which a hole is filled with conductive material.

The array substrate according to an embodiment of the present disclosure may further include a storage capacitor 31. The storage capacitor 31 may include a first electrode plate 310 and a second electrode plate 311 opposite to each other in a thickness direction of the array substrate. The first electrode plate 310 may be disposed in the same layer as and connected with the first common line 26. The second electrode plate 311 may be disposed in the same layer as the first terminal 282 and the second terminal 283 of the transistor 28. The second electrode plate 311 may be connected with the second terminal 283 of the transistor 28. It should be noted that, the first conductive connection portion 211 of the sub-pixel electrode may be connected with the second electrode plate 311 through the fourth through-hole structure K4, so that the first conductive connection portion 211 of the sub-pixel electrode is connected with the second terminal 283 of the transistor 28.

In view of above, in the array substrate according to an embodiment of the present disclosure, the first sub-wiring area 201 is provided with two columns of the second scanning lines 24 and one column of the data line 25; the second sub-wiring area 202 is provided with one column of the second scanning line 24, one column of the second common line 27 and one column of the data line 25; and the third wiring area 203 is provided with one column of the data line 25, wherein each row of the first scanning line 23 is connected with two columns of the second scanning lines 24 through the first through-hole structure K1. The array substrate may be used in a display panel with 4K 60 Hz.

In the array substrate according to another embodiment of the present disclosure, the first sub-wiring area 201 is provided with two columns of the second scanning lines 24 and two columns of the data lines 25; the second sub-wiring area 202 is provided with one column of the second scanning line 24, one column of the second common line 27, and two columns of the data lines 25; and the third wiring area 203 is provided with two columns of the data lines 25, wherein each row of the first scanning line 23 is connected with two columns of the second scanning lines 24 through the first through-hole structure K1. The array substrate may be used in a display panel with 4K 120 Hz or 8K 60 Hz.

It should be noted that, the aforementioned 4K and 8K refer to the resolution of the display panel, and 60 Hz and 120 Hz refer to the refresh rate of the display panel.

An embodiment of the present disclosure further provides a display panel, which includes the array substrate as described in any of the above embodiments. It should be understood that the display panel may be a liquid crystal panel. Therefore, the display panel may further include a counter substrate disposed in alignment with and opposite to the array substrate, and liquid crystal molecules disposed between the counter substrate and the array substrate.

Figure 17:
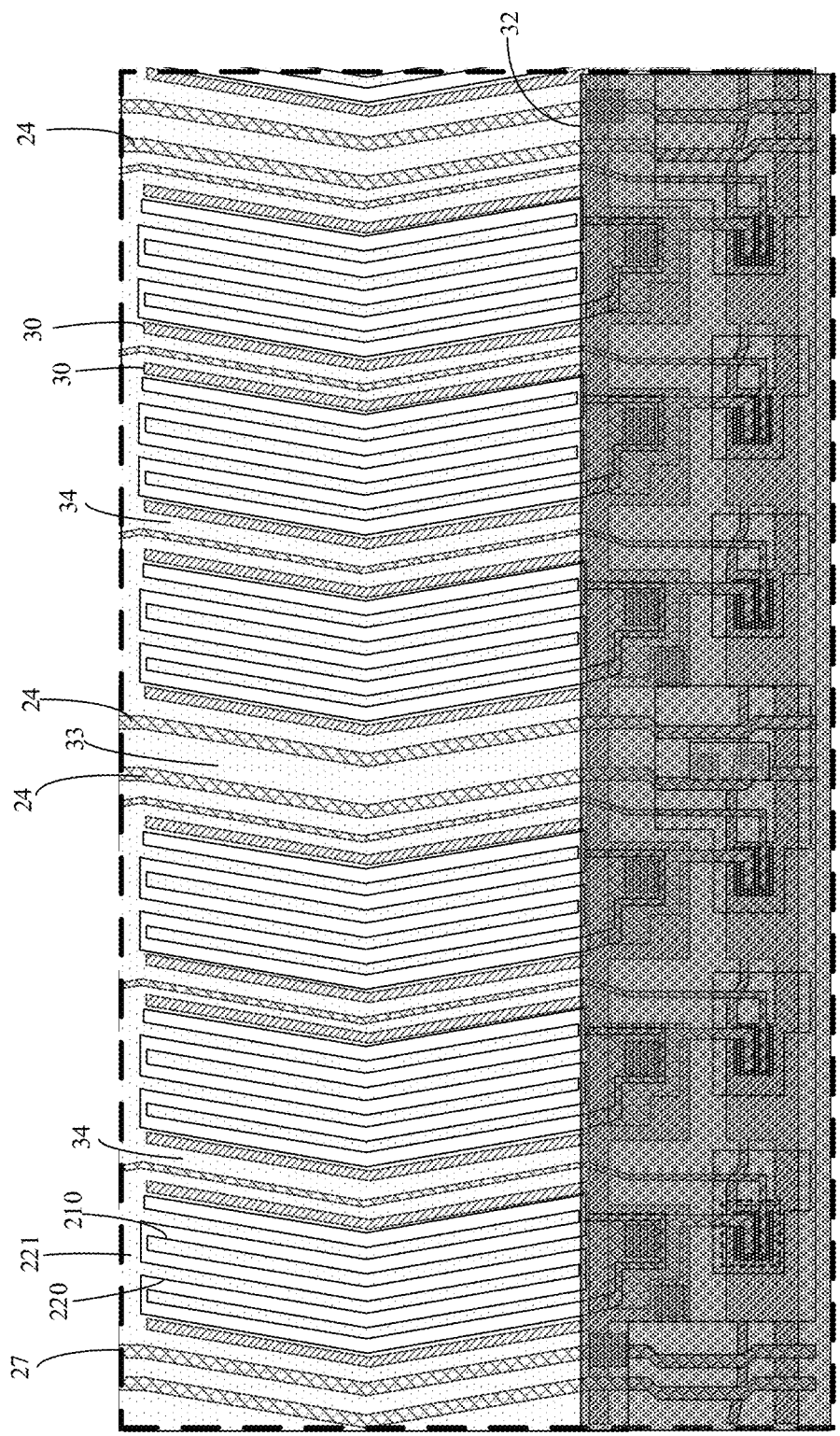
FIG. 17 is a schematic diagram of the positional relationship between the black matrix and the array substrate shown in FIG. 11.

It is not necessary to provide a color filter layer on the counter substrate when the aforementioned color filter layer is disposed in the array substrate. In this case, the counter substrate may include a second base substrate (not shown) and a black matrix 32 disposed on the side of the second base substrate facing the array substrate, as shown in FIG. 17.

It should be understood that, a color filter layer may be provided on the counter substrate when there is no such color filter layer as mentioned previously on the array substrate.

An embodiment of the present disclosure also provides an electronic device that includes the display panel as previously described.

According to an embodiment of the present disclosure, the specific type of the electronic device is not particularly limited, and all common types of the electronic device in the art are available, specifically, for example, an LCD TV, a mobile phone, a computer, or a watch, etc. It may be selected accordingly by those skilled in the art according to the specific use of the electronic device, which will not be repeated here.

It should be noted that, in addition to the display panel, the electronic device also includes other necessary parts and components. Taking a monitor as an example, specifically, for example, a case, a circuit board, or a power cord, etc. may be included. Those skilled in the art may introduce corresponding supplements according to the specific use requirements of the electronic device, which will not be repeated here.

Unless otherwise specified, the term "in the same layer" as used in the present disclosure means that two layers, parts, components, elements, or portions may be formed by the same patterning process, and the two layers, parts, components, elements, or portions are generally formed of the same material.

Unless otherwise specified, the expression "patterning process" in the present disclosure generally includes the steps of photoresist coating, exposure, development, etching, and photoresist stripping. The expression "one-time patterning process" means the process of forming patterned layers, parts, components, etc., using one mask.

The ordinal numbers such as "first", "second", "third" and "fourth" in the present specification are provided to avoid the confusion of constituent elements, rather than to limit in terms of quantity.

Unless otherwise expressly stated and limited, the terms "installation", "connection" and "connection" in the present specification should be interpreted broadly. For example, it may be a fixed connection, a detachable connection, or an integral connection. It may be a mechanical connection or an electrical connection. It may be a direct connection, an indirect connection through an intermediate piece, or a connection between two elements. For those of ordinary skill in the art, the specific meanings of the above-mentioned terms in the present disclosure may be understood in specific situations.

Those skilled in the art will easily think of other embodiments of the present disclosure after considering the specification and practicing the content disclosed herein. The present disclosure is intended to cover any variations, uses, or adaptive changes of the present disclosure. These variations, uses, or adaptive changes follow the general principle of the present disclosure and include common knowledge or conventional technical means in the technical field that are not disclosed in the present disclosure. The specification and the embodiments are only regarded as exemplary, and the true scope and spirit of the present disclosure are defined by the claims.

What is claimed is:

1. A display panel, comprising:
   Q rows of first scanning line groups arranged sequentially along a column direction;
   M columns of second scanning line groups arranged sequentially along a row direction; and
   at least one gate drive circuit, located on a side of a Q-th row of the first scanning line groups away from a (Q−1)-th row of the first scanning line groups, wherein:
   each gate drive circuit comprises Q columns of shift register unit groups cascaded in stages;
   a q-th stage of the shift register unit groups is connected with a q-th row of the first scanning line groups through at least one column of the second scanning line groups;

$M \geq Q > 1;$ q=1 or 1<q≤Q; and

M, Q, and q are all positive integers, wherein
   in the gate drive circuit, the shift register unit groups from a 1-st stage to a Q-th stage are arranged sequentially along the row direction;
   the gate drive circuit comprises a first gate drive circuit and a second gate drive circuit; and
   the Q-th stage of the shift register unit groups in the first gate drive circuit is disposed adjacent to the Q-th stage of the shift register unit groups in the second gate drive circuit or adjacent to the 1-st stage of the shift register unit groups in the second gate drive circuit.

2. The display panel according to claim 1, wherein
   each column of the second scanning line groups comprises a column of a second scanning line;
   each row of the first scanning line groups comprises a row of a first scanning line;
   each column of the shift register unit groups in each gate drive circuit comprises a column of shift register units; and
   one column of the shift register units is connected with one row of the first scanning line through one column of the second scanning line.

3. The display panel according to claim 1, wherein:
   each row of the first scanning line groups comprises P rows of first scanning lines which are arranged sequentially from a side away from the gate drive circuit to a side adjacent to the gate drive circuit;
   each column of the second scanning line groups comprises P columns of second scanning lines which are arranged sequentially along the row direction;
   each column of the shift register unit groups in each gate drive circuit comprises P columns of shift register units cascaded in stages, and a p-th stage of the shift register units in each shift register unit groups in each gate drive circuit is connected with the a p-th row of the first scanning lines in each row of the first scanning line groups through one column of the second scanning lines; and
   P>1, 1≤p≤P, and P, p are both positive integers.

4. The display panel according to claim 3, wherein
   P columns of the shift register units in each column of the shift register unit groups in each gate drive circuit are arranged sequentially along the row direction, and
   at least one column of the shift register units in each column of the shift register unit groups in each gate drive circuit are target shift register units having a number of stages different from a number of columns in the target shift register units.

5. The display panel according to claim 4, wherein
   among two adjacent columns of the shift register units in each column of the shift register unit groups in each gate drive circuit, a difference between the number of columns and the number of stages in one column of the shift register units is not equal to the difference between the number of columns and the number of stages in the other column of the shift register units.

6. The display panel according to claim 5, wherein the number of columns corresponding to the p-th stage of the shift register units in each shift register unit group of each gate drive circuit is equal to each other.

7. The display panel according to claim 6, wherein
   a Q-th stage of the shift register unit groups in the first gate drive circuit is disposed adjacent to the Q-th stage of the shift register unit groups in the second gate drive circuit; and
   a q-th stage of the shift register unit groups in the first gate drive circuit is disposed axisymmetrically with respect to the q-th stage of the shift register unit groups in the second gate drive circuit.

8. The display panel according to claim 6, wherein
   a Q-th stage of the shift register unit groups in the first gate drive circuit is disposed adjacent to a 1-st stage of the shift register unit groups in the second gate drive circuit; and
   the number of columns of a p-th stage of the shift register units in a q-th stage of the shift register unit groups in the first gate drive circuit is equal to the number of columns of the p-th stage of the shift register units in the q-th stage of the shift register unit groups in the second gate drive circuit.

9. The display panel according to claim 3, further comprising: P rows of clock signal lines arranged sequentially along the column direction, wherein a p-th stage of the shift register units in each column of the shift register unit groups in each gate drive circuit is connected with a p-th row of the clock signal lines.

10. The display panel according to claim 2, further comprising:
    a plurality of columns of data lines, arranged sequentially along the row direction;
    at least one source drive circuit, located on a same side of the display panel as the gate drive circuit, and connected with the data lines; and
    a plurality of pixel units, arranged in an array along the row direction and the column direction, wherein each pixel unit comprises a plurality of sub-pixels arranged sequentially along the row direction, and the sub-pixels are connected with the data lines and the first scanning lines,
    wherein at least one column of the data lines is arranged between any two adjacent columns of the sub-pixels along the row direction, at least one column of the second scanning lines is arranged between any adjacent pixel units along the row direction, and at least one row of the first scanning lines is arranged between any adjacent pixel units along the column direction; and wherein the first scanning lines are connected with the second scanning lines through a first through-hole structure.

11. The display panel according to claim 10, further comprising: a plurality of rows of first common lines arranged sequentially along the column direction, and a plurality of columns of second common lines arranged sequentially along the row direction, wherein the first common lines and the second common lines are connected with the sub-pixels through a second through-hole structure and a third through-hole structure, respectively; and one column of the second common lines is disposed between at least part of adjacent pixel units along the row direction, and one row of the first common lines is disposed between any adjacent pixel units along the column direction.

12. The display panel according to claim 11, wherein one column of the data lines is disposed between any two adjacent columns of the sub-pixels along the row direction, and each sub-pixel in each column of the sub-pixels is connected with one column of the data lines adjacent to the sub-pixel;

one row of the first scanning lines and one row of the first common lines are disposed between any adjacent pixel units along the column direction, and each sub-pixel in each row of the sub-pixels is connected with one column of the first scanning lines adjacent to the sub-pixel; and one column of the second scanning lines and one column of the second common lines are disposed between part of two adjacent columns of the pixel units along the row direction, and two columns of the second scanning lines are disposed between another part of the two adjacent columns of the pixel units along the row direction.

13. The display panel according to claim 12, wherein the display panel has a plurality of columns of first wiring areas which are disposed between any adjacent pixel units along the column direction, wherein the plurality of columns of the first wiring areas comprises first sub-wiring areas and second sub-wiring areas, two columns of the second scanning lines are disposed in each column of the first sub-wiring areas, two columns of the second scanning lines in a same first sub-wiring area are connected with different rows of the first scanning lines through a through-hole structure, respectively, and one column of the second scanning lines is disposed in each column of the second sub-wiring areas; and wherein the plurality of columns of first wiring areas comprises a plurality of columns of first wiring area groups, each column of the first wiring area groups comprises 8 columns of first wiring areas arranged sequentially along the row direction, a n-th column of the first wiring areas in each column of the first wiring area groups are the first sub-wiring areas, and remaining 7 columns of the first wiring areas in each column of the first wiring area groups are the second sub-wiring areas, where 1≤n≤8, and n is a positive integer.

14. The display panel according to claim 11, wherein each sub-pixel comprise:

a sub-pixel electrode, having a plurality of first electrode strips arranged at intervals along the row direction;

a common electrode, disposed in a same layer as the sub-pixel electrode, wherein the common electrode has a plurality of second electrode strips arranged at intervals along the row direction, the second electrode strips and the first electrode strips are alternately arranged along the row direction, and the common electrode is connected with the second common lines and the first common lines through the third through-hole structure and the second through-hole structure, respectively; and a transistor, comprising a gate, an active layer, and a first terminal and a second terminal disposed in a same layer, wherein the gate is disposed in a same layer and connected with the first scanning lines; the first terminal is connected with one end of the active layer, and the first terminal is disposed in a same layer as and connected with the data lines; and the second terminal is connected with the other end of the active layer, and further connected with the sub-pixel electrode through a fourth through-hole structure.

15. The display panel according to claim 14, wherein the common electrode of each sub-pixel is connected with each other.

16. The display panel according to claim 10, wherein a plurality of the first through-hole structures is provided comprising a first group and a second group; a number of the first through-hole structures in the first group is equal to that of the shift register units in the first gate drive circuit, and each first through-hole structure in the first group is connected with a respective shift register unit in the first gate drive circuit; and a number of the first through-hole structures in the second group is equal to that of the shift register units in the second gate drive circuit, and each first through-hole structure in the second group is connected with a respective shift register unit in the second gate drive circuit; and the first group is axisymmetric with respect to the second group; or a distance between the first through-hole structures located in a same row in the first group and the second group is a through-hole distance, wherein the through-hole distance of each row is equal to each other.

17. The display panel according to claim 10, wherein each pixel unit comprises three sub-pixels, respectively a red sub-pixel, a green sub-pixel, and a blue sub-pixel, arranged sequentially along the row direction, wherein among two adjacent pixel units along the row direction, the red sub-pixel of one pixel unit is adjacent to the blue sub-pixel of the other pixel unit.

18. An electronic device, comprising:

a display panel, comprising:

Q rows of first scanning line groups arranged sequentially along a column direction;

M columns of second scanning line groups arranged sequentially along a row direction; and at least one gate drive circuit, located on a side of a Q-th row of the first scanning line groups away from a (Q−1)-th row of the first scanning line groups, wherein:

each gate drive circuit comprises Q columns of shift register unit groups cascaded in stages;

a q-th stage of the shift register unit groups is connected with a q-th row of the first scanning line groups through at least one column of the second scanning line groups;

$M \geq Q > 1$;

$q=1$ or $1 < q \leq Q$; and

M, Q, and q are all positive integers, wherein in the gate drive circuit, the shift register unit groups from a 1-st stage to a Q-th stage are arranged sequentially along the row direction;

the gate drive circuit comprises a first gate drive circuit and a second gate drive circuit; and the Q-th stage of the shift register unit groups in the first gate drive circuit is disposed adjacent to the Q-th stage of the shift register unit groups in the second gate drive circuit or adjacent to the 1-st stage of the shift register unit groups in the second gate drive circuit.

\* \* \* \* \*